United States Patent
Berridge

(10) Patent No.: US 11,048,057 B2
(45) Date of Patent: Jun. 29, 2021

(54) CASSETTE ADAPTER AND METHOD OF INSTALLATION

(71) Applicant: Panduit Corp., Tinley Park, IL (US)

(72) Inventor: Benjamin J. Berridge, Highland, IN (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 16/724,690

(22) Filed: Dec. 23, 2019

(65) Prior Publication Data

US 2020/0124816 A1    Apr. 23, 2020

Related U.S. Application Data

(63) Continuation of application No. 16/016,019, filed on Jun. 22, 2018, now Pat. No. 10,571,640.

(51) Int. Cl.
*G02B 6/44* (2006.01)
*H05K 7/14* (2006.01)

(52) U.S. Cl.
CPC ......... *G02B 6/4453* (2013.01); *G02B 6/4452* (2013.01); *H05K 7/1401* (2013.01); *H05K 7/1489* (2013.01)

(58) Field of Classification Search
CPC ........ G02B 6/4439–4455; H05K 5/00–7/2099
See application file for complete search history.

(56) References Cited

U.S. PATENT DOCUMENTS

| | | |
|---|---|---|
| 4,961,711 A | 10/1990 | Fujiura et al. |
| 5,088,932 A | 2/1992 | Nakamura |
| 5,167,523 A | 12/1992 | Crimmins et al. |
| 5,383,794 A | 1/1995 | Davis et al. |
| 5,486,117 A | 1/1996 | Chang |
| 5,836,786 A | 11/1998 | Pepe |
| 5,902,155 A | 5/1999 | Polgar et al. |
| 5,941,726 A | 8/1999 | Koegel et al. |
| 6,056,578 A | 5/2000 | Lin |
| 6,083,049 A | 7/2000 | Kuo et al. |
| 6,305,986 B1 | 10/2001 | Hwang |
| 6,497,395 B1 | 12/2002 | Croker |
| 6,537,106 B1 | 3/2003 | Follingstad |
| 6,666,709 B2 | 12/2003 | Andresen et al. |
| 7,192,307 B1 | 3/2007 | Tran et al. |
| 7,854,624 B1 | 12/2010 | Pepe |
| 8,346,046 B2 | 1/2013 | Wagner et al. |
| 8,428,418 B2 | 4/2013 | Smrha |
| 9,075,216 B2 | 7/2015 | Cote et al. |
| 9,420,715 B2 | 8/2016 | Vasilevsky |
| 9,720,715 B2 | 8/2017 | Zaifman et al. |
| 2010/0111481 A1 | 5/2010 | Burek |
| 2012/0328258 A1 | 12/2012 | Barron et al. |
| 2014/0037259 A1 | 2/2014 | Bragg |
| 2014/0241691 A1 | 8/2014 | Solheid et al. |

(Continued)

*Primary Examiner* — Charlie Y Peng

(74) *Attorney, Agent, or Firm* — Christopher S. Clancy; James H. Williams; Peter S. Lee

(57) ABSTRACT

A cassette adapter for the installation of a cassette in a patch panel of a data rack including a base configured to accept the cassette, a front frame connected to a distal end of the base, at least one latch connected to the base, and a mounting portion configured to mount the cassette adapter to the panel. The cassette adapter being configured to retain the cassette within the cassette adapter and connect the cassette to the patch panel in a removable fashion.

8 Claims, 19 Drawing Sheets

(56) References Cited

U.S. PATENT DOCUMENTS

| | | |
|---|---|---|
| 2014/0348467 A1 | 11/2014 | Cote et al. |
| 2015/0098683 A1* | 4/2015 | Gross ................... G02B 6/4455 385/135 |
| 2015/0212286 A1 | 7/2015 | Vongseng et al. |
| 2015/0316737 A1 | 11/2015 | McPhil et al. |
| 2016/0077298 A1 | 3/2016 | Wiltjer et al. |
| 2017/0131500 A1 | 5/2017 | Sauter et al. |
| 2017/0153399 A1 | 6/2017 | Rodriguez |
| 2018/0003912 A1* | 1/2018 | Sedor ................... G02B 6/3897 |

* cited by examiner

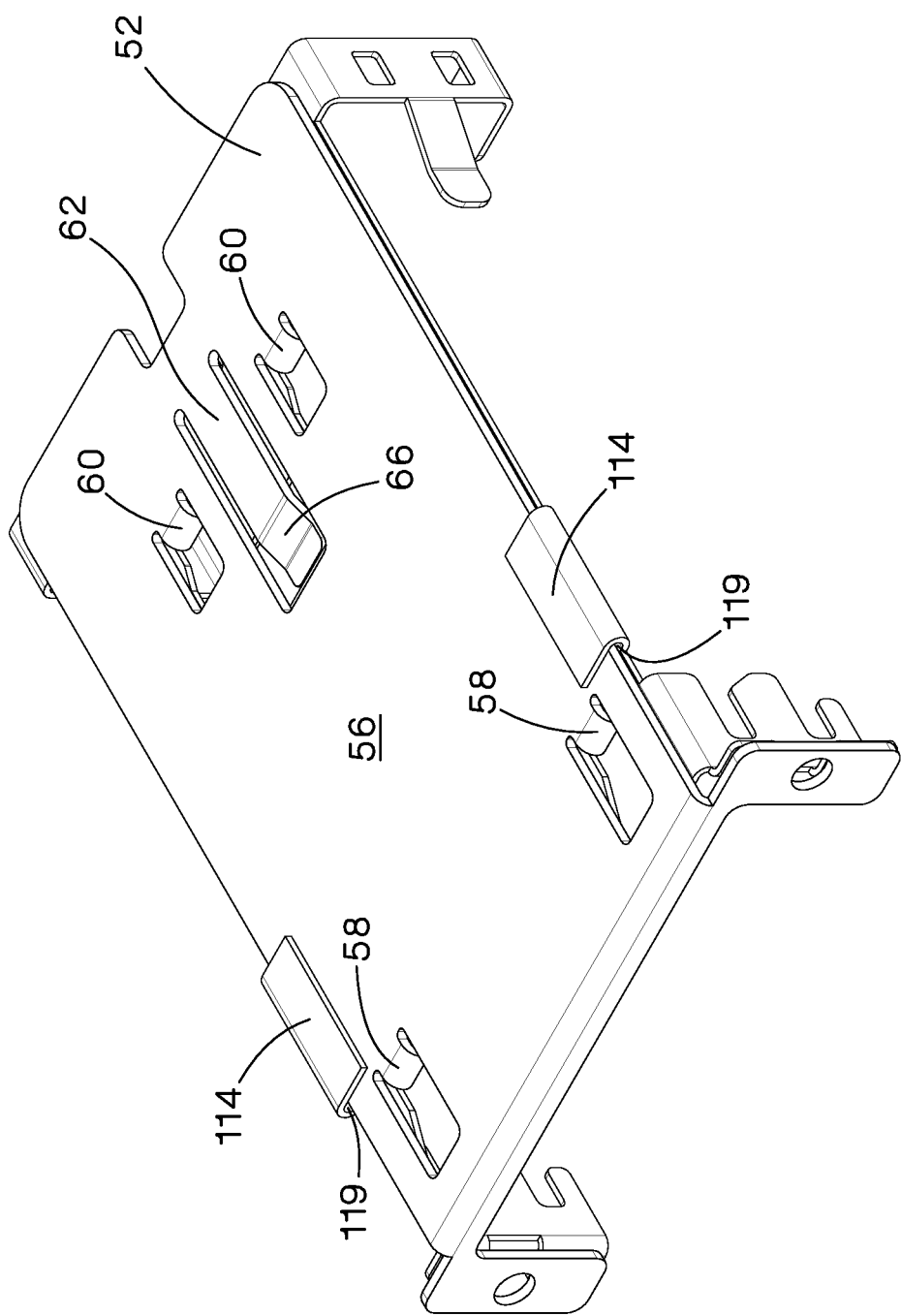

CASSETTE ADAPTER AND METHOD OF INSTALLATION

CROSS REFERENCE TO RELATED APPLICATIONS

This application is a continuation of U.S. patent application Ser. No. 16/016,019, filed Jun. 22, 2018, the subject matter of which is hereby incorporated by reference in its entirety.

FIELD OF THE INVENTION

The present invention relates to a cassette adapter for attaching cassettes in a patch panel of a rack having connection characteristic different from the patch panel.

BACKGROUND OF THE INVENTION

Pre-terminated copper or fiber-optic cable cassettes are utilized in the installation of cables to patch panels within a data rack. Patch panels have typically been designed to accommodate a particular cassette configuration as a system. Cassettes designed to connect to a patch panel typically do not directly attach to differently configured patch panel. Further, earlier iterations of cassettes provide for a limited number of connections within a cassette and patch panel. Many users of data centers are looking to transition to smaller Local Connector adapters ("LC adapters") or Multi-fiber Push-on/Pull-off adapters ("MPO adapters") to increase the density within a patch panel to accommodate demand for high bandwidth. Existing high-density cassettes are not configured to be interchangeable with older or differently configured patch panels. Further, patch panels configured for low density cassettes are not typically configured to accept a direct connection with high-density cassettes.

SUMMARY OF THE INVENTION

The present invention provides a cassette adapter for installation of a cassette in a patch panel, the cassette adapter including a base configured to accept the cassette, a front frame connected to a distal end of the base, at least one latch connected to the base, and a mounting portion configured to mount the cassette adapter to the patch panel.

BRIEF DESCRIPTION OF THE DRAWINGS

Objects, features, and advantages of the present invention will become apparent upon reading the following description in conjunction with the drawing figures in which:

FIG. 5A depicts a top perspective view of the cassette adapter of FIG. 1.

DETAILED DESCRIPTION

The disclosed cassette adapter solves or improves upon one or more of the above noted and/or other problems and disadvantages with prior cassette and patch panel systems. The disclosed cassette adapter facilitates interchangeability between cassettes of one system with patch panels of another system. The disclosed cassette adapter further facilitates installation of high-density cassettes within a patch panel configured for low-density cassettes. These and other objects, features, and advantages of the present disclosure will become apparent to those having ordinary skill in the art upon reading this disclosure.

Figure 1:
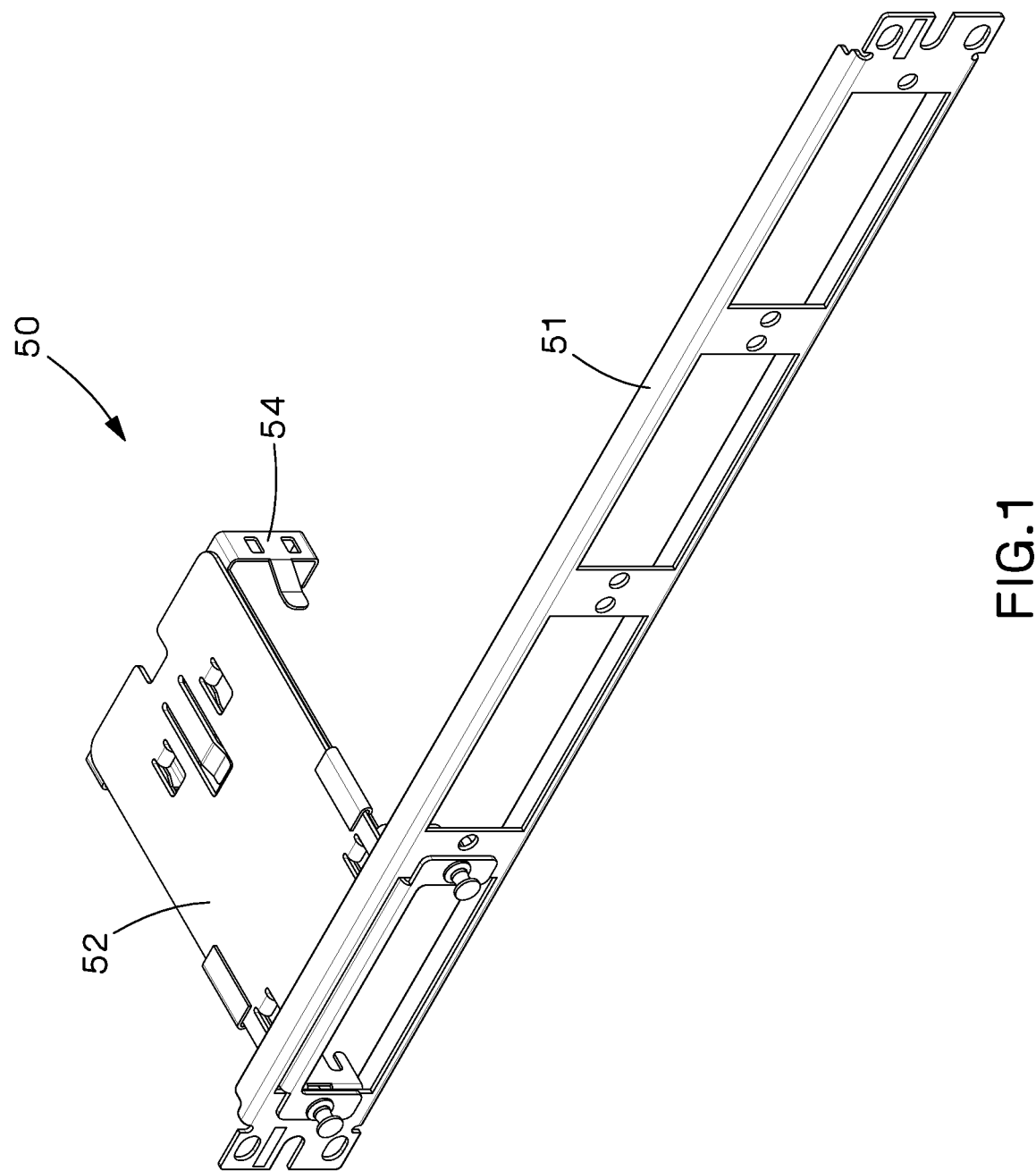
FIG. 1 depicts a perspective view of one example of a cassette adapter attached to one example of a patch panel according to the teachings of the present disclosure.

Turning now to the drawings, FIG. 1 depicts one example of a cassette adapter 50 of the present invention. The cassette adapter 50 includes a front insert 52 and a rear insert 54. The cassette adapter 50 is configured to attach to one example of a patch panel 51 within a high-density fiber enclosure system.

Figure 2A:
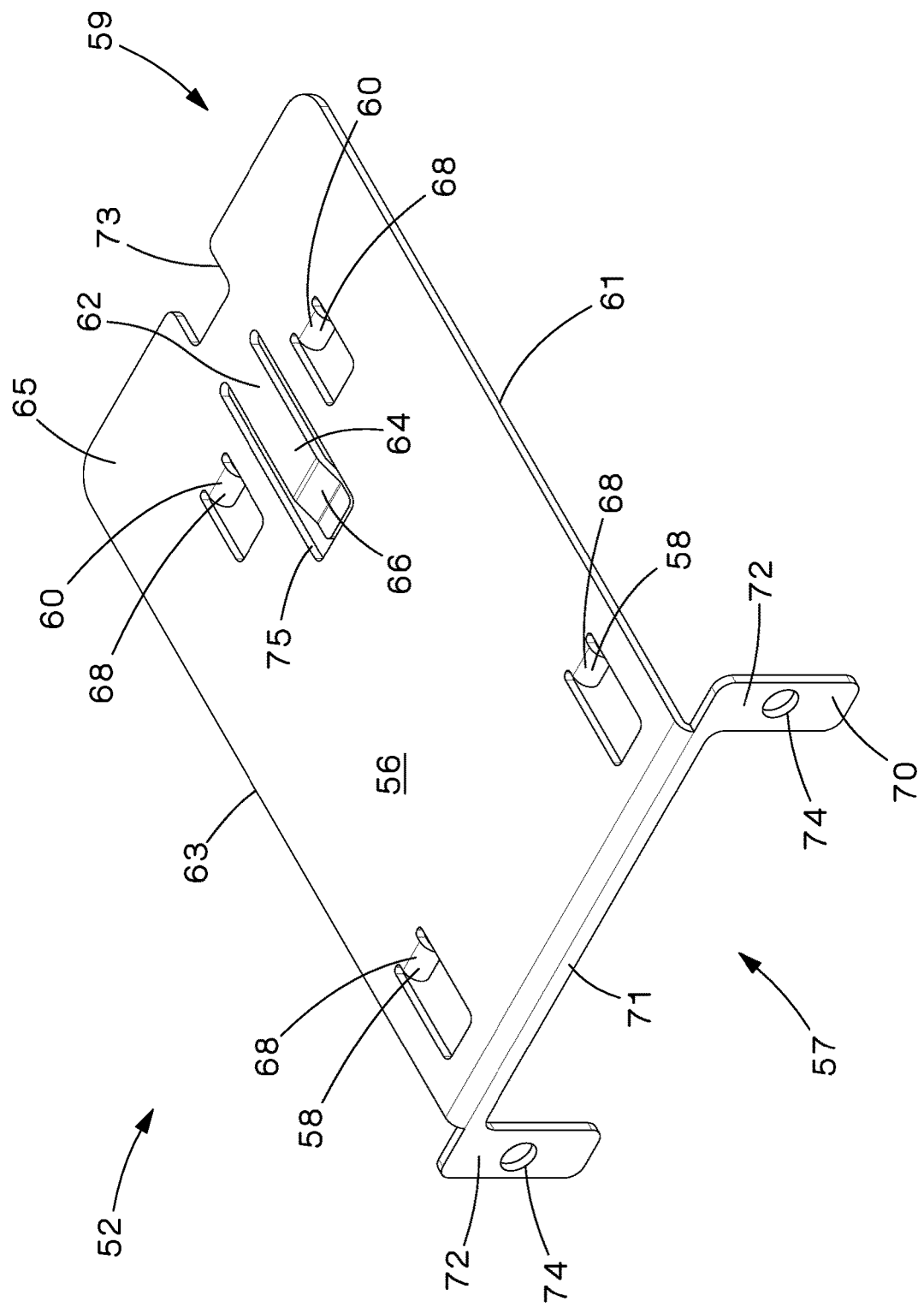
FIG. 2A depicts a top perspective view of a front insert of the cassette adapter of FIG. 1.
Figure 2B:
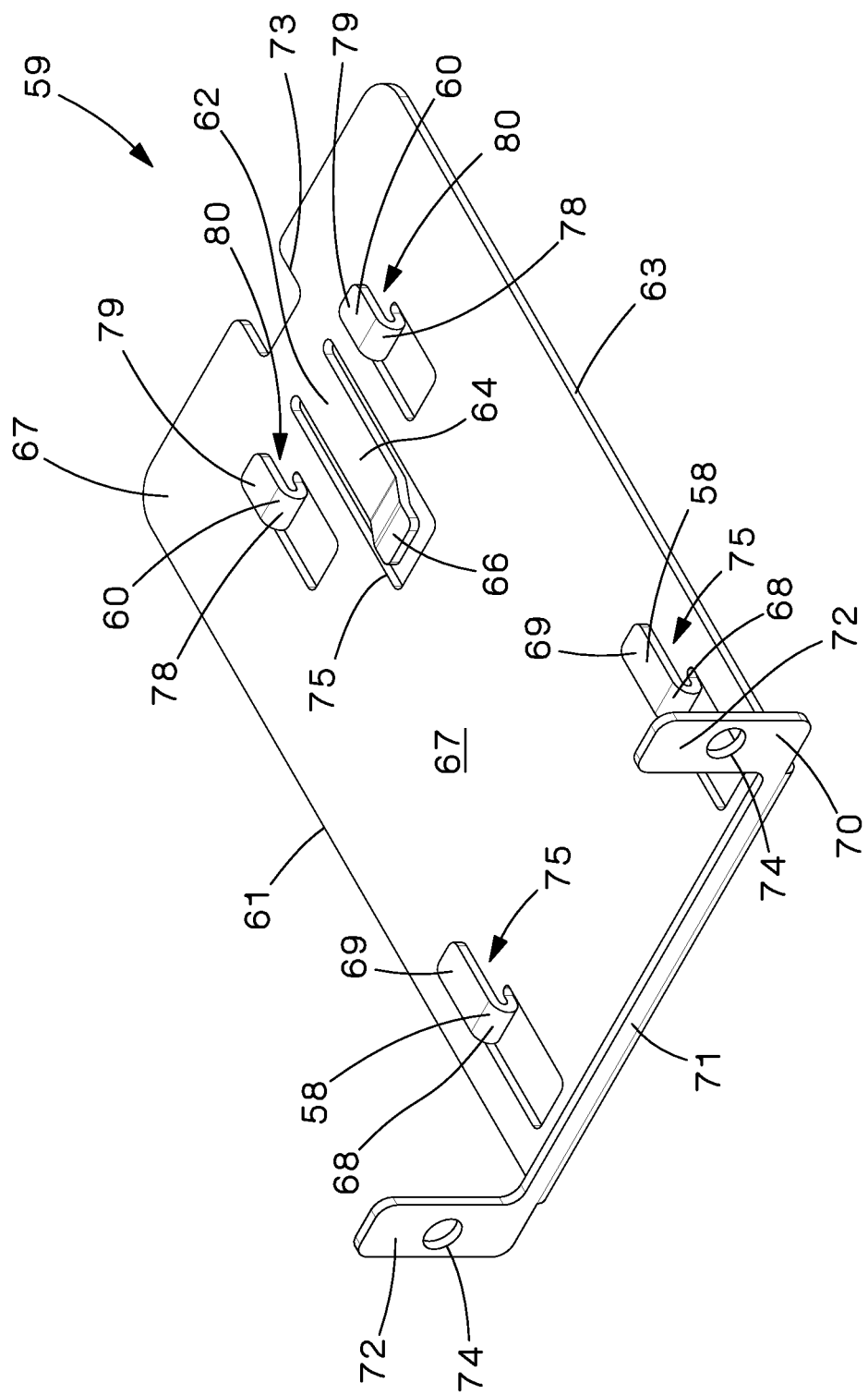
FIG. 2B depicts an underside perspective view of the front insert of the cassette adapter of FIG. 1.

FIGS. 2A and 2B depict the front insert 52 of the cassette adapter of FIG. 1. FIG. 2A depicts an isometric view of the top of the front insert 52. FIG. 2B depicts an isometric view of the underside of the front insert 52. The front insert 52 includes a base 56. The base 56 includes a front 57, a rear 59, a first side 61, a second side 63, an upper surface 65, and an underside surface 67. The base 56 is generally rectangular with the first and second sides 61, 63 being longer than the front 57 and rear 59. The upper surface 65 and underside surface 67 are generally planar.

As depicted in FIGS. 2A and 2B, two extended helms 58 are disposed near the front 57 of the base 56. One extended helm 58 resides one along the first side 61 and the other extended helm 58 resides along the second side 63. The extended helms 58 include a first portion 68 that extends away from the underside surface 67. A second portion 69 of the extended helms 58 extend from the first portion 68 towards the rear 59 of the front insert 52. The second portion 69 of the extended helms 58 are generally parallel with a plane of the underside surface 67 of the base 56. The configuration of the extended helms 58 and the underside surface 67 of the base 56 form catches 75.

FIGS. 2A and 2B also depict two shortened helms 60 near the rear 59 of the front insert 52. The shortened helms 60 reside near a center of the base 56. The shortened helms 60 include a first portion 78 that extends away from the underside surface 67 and a second portion 79 that extends from the first portion 78 towards the rear 59 of the front insert 52. The second portion 79 of the shortened helms 60 are generally parallel with a plane of the underside surface 67 of the base 56. The configuration of the shortened helms 60 and the underside surface 67 of the base 56 form catches 80.

Depicted in FIGS. 2A and 2B, near the rear 59 of the front insert 52 and between the shortened helms 60, is a snap finger 62. The snap finger 62 includes an arm 64 and an engaging portion 66. The arm 64 of the snap finger 62 resides within an opening 76 the base 56, between a plane of the upper surface 65 and a plane of the underside surface 67 of the base 56. The arm 64 of the snap finger 62 is connected to the base 56 at a first end. The arm 64 is an elongated member extending from the first end towards the front 57 of the front insert 52. The engaging portion 66 is connected to a second end of the arm 64.

The engaging portion 66 includes a first element that extends at an angle away from the arm 64 and underside surface 67 of the base 56. The engaging portion 66 further includes a second element that extends towards the front 57 of the base 56 generally parallel with the underside 67. The second element of the engaging portion 66, is offset from the underside surface 67 and configured to engage a connector of the rear insert 54.

As depicted in FIGS. 2A and 2B, disposed adjacent the snap finger 62, is a cutout 73. The cutout 73 is located in the rear 59 of the base 56. The cutout 73 is rectangularly shaped and inset into the base 56.

Further depicted in FIGS. 2A and 2B at the front 57 of the base 56 is a frame 70. The frame 70 includes a bottom segment 71 that is connected with the front 57 of the base 56. The bottom segment 71 extends away from the underside surface 67 at generally a right angle. The bottom segment 71 generally spans the width of the front 57 of the base 56.

At each end of the bottom segment 71 are mounting portions including posts 72. The posts 72 are generally rectangularly shaped. The posts 72 are connected to the bottom segment 71 at the distal ends and may reside in the same plane as the bottom segment 71. The posts 72 extend vertically away from the bottom segment 71. An aperture 74 is located in each of the posts 72. The aperture 74 is configured to accept a fastener to mount the cassette adapter 50 to the patch panel 51.

Figure 3A:
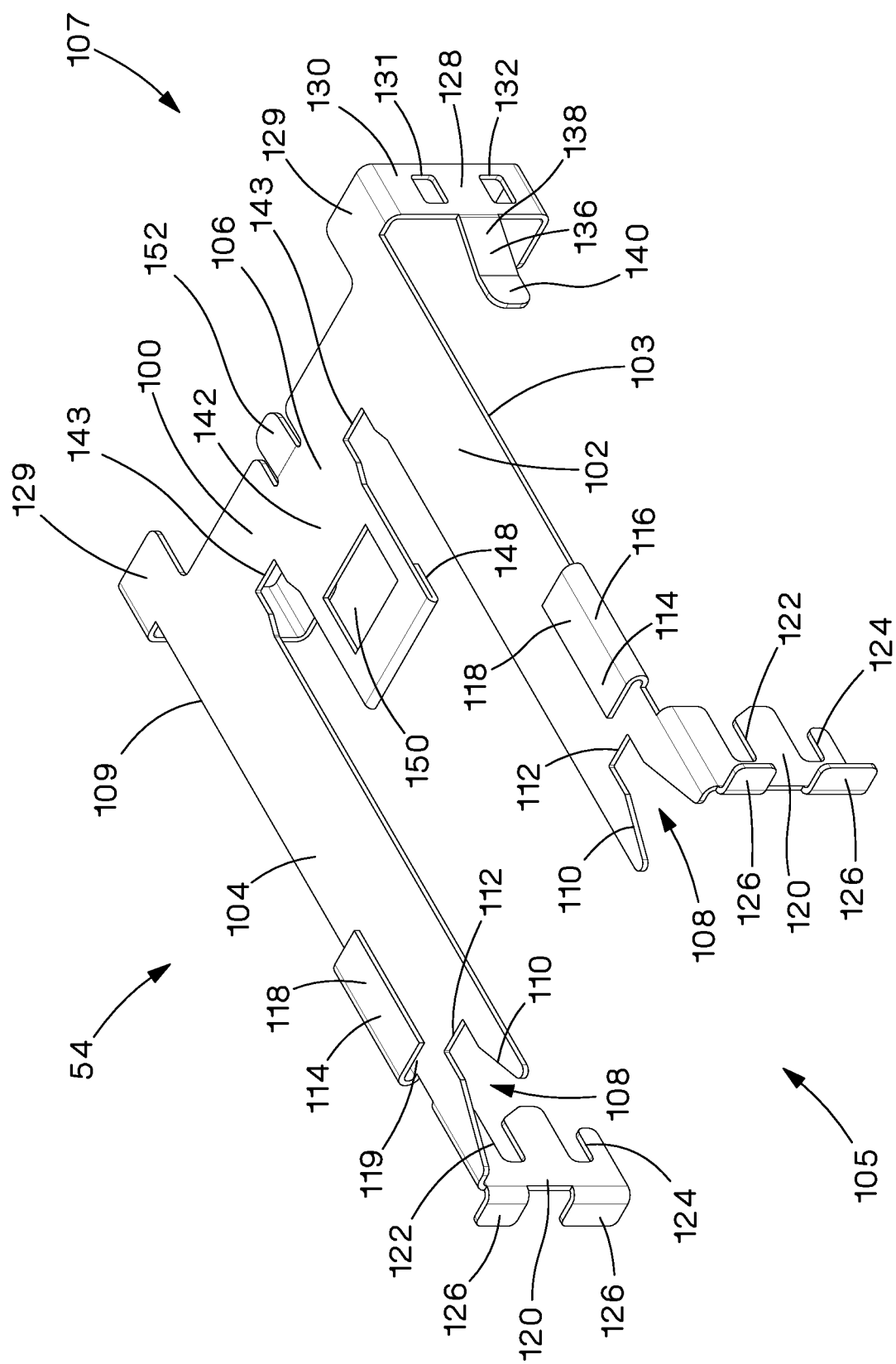
FIG. 3A depicts a top perspective view of a rear insert of the cassette adapter of FIG. 1.
Figure 3B:
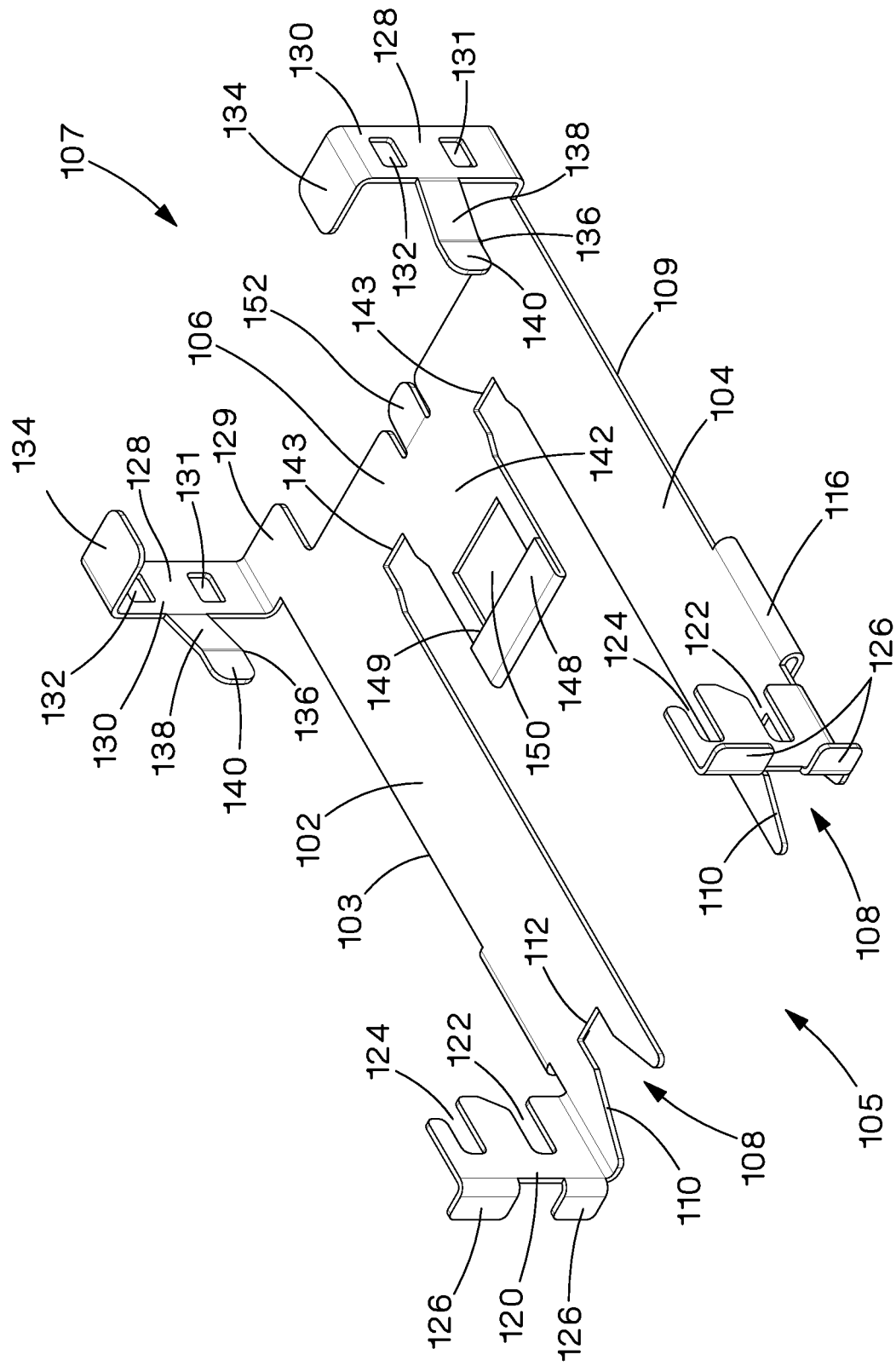
FIG. 3B depicts an underside perspective view of the rear insert of the cassette adapter of FIG. 1.

FIGS. 3A and 3B depict the rear insert 54 of the cassette adapter 50. FIG. 3A is an isometric view of the top of the rear insert 54 and FIG. 3B is an isometric view of the underside of the rear insert 54. The rear insert 54 includes a first side 103, front 105, rear 107, and second side 109. The rear insert 54 includes a base 100 having a footprint that is generally U-shaped. The overall length and width of the rear insert 54 base 100 may be approximately the same length and width as the base 56 of the front insert 52.

The rear insert 54 base 100 includes a first element 102 and a second element 104 as depicted in FIGS. 3A and 3B. First and second elements 102, 104 may be provided as an elongated rectangular shape, extending from approximately the front 105 of the base 100 to approximately the rear 107 of the base 100. The first and second elements 102, 104 are mirrored elements. The first element 102 may be on the first side 103 of the base 100 and the second element 104 may be on the second side 109 of the base 100. First and second elements 102, 104 are connected by a connecting element 106.

As depicted in FIGS. 3A and 3B, the first and second elements 102, 104 may each include centering channels 108 at the front 105 of the base 100. The centering channels 108 include a V-shaped cutout 110 and an engagement cutout 112. The V-shaped cutout 110 is disposed within the first and second elements 102, 104 such that the widest portion opens towards the front 105 of the base 100. The V-shaped cutout 110 then narrows as it extends into the base 100 towards the rear 107 of the base 100. The narrowest portion of the V-shaped cutout 110 is connected with the engagement cutout 112.

The engagement cutouts 112 are generally square shaped. The engagement cutouts 112 extend from the V-shaped cutout 110 towards the rear 107 of the rear insert 54. The engagement cutouts 112 are sized and shaped to accept the extended helms 58 of the front insert 52.

As depicted in FIGS. 3A and 3B, adjacent the engagement cutouts 112 of the centering channels 108 on each of the first and second elements 102, 104 are front cassette retainers 120. The front cassette retainers 120 are planar and extend down from the base 100 at approximately a right angle. An upper slot 122 and a lower slot 124 are located within each of the front cassette retainers 120. Each of the upper slot 122 and lower slot 124 are configured to retain a front post of a cassette as further described below.

Figure 4:
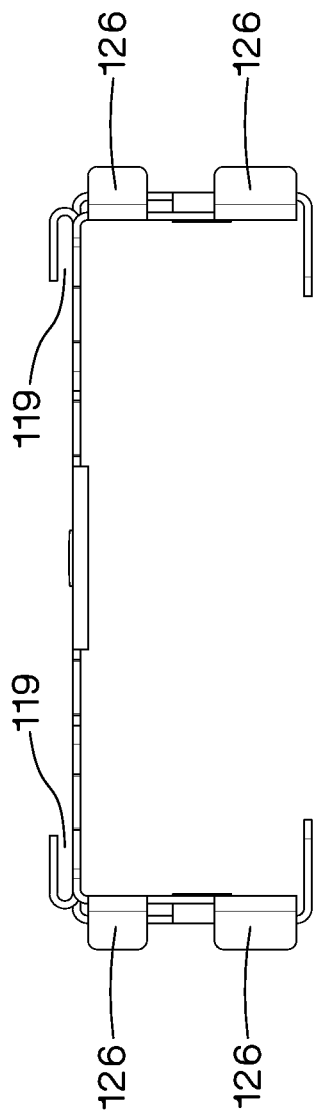
FIG. 4 depicts a front view of the rear insert of FIG. 3A.

Connected to the front cassette retainers 120 are flanges 126. As depicted in FIGS. 3A, 3B, and 4, the flanges 126 extend from the front cassette retainers 120 horizontally at approximately a right angle. A space may exist between the flanges 126 on each of the first element 102 and second element 104 to accommodate a fastener between the flanges 126. The flanges 126 are configured to support the front insert 54 against a faceplate of the patch panel 51.

FIGS. 3A and 3B further depict a pair of retaining guides 114 disposed on both the first element 102 and second element 104. As depicted in FIGS. 3A and 3B, the retaining guides 114 include a bend 116 and a planar portion 118. The bend 116 includes a first end connected to the base 100. The bend 116 is a radiused section between the base 100 and the planar portion 118. The bend 116 extends along a portion of the length of each of the first and second elements, 102, 104.

A first end of the planar portion 118 is connected to the second end of the bend 116. The planar portions 118 are generally rectangularly shaped and may be the same width as the bend 116. The planar portions 118 transverse the length of the first and second elements, 102, 104.

As depicted in FIGS. 3A and 4, the planar portion 118 resides above each of the first and second elements 102, 104 in a parallel orientation forming a slot 119. The slot 119 is configured to accept a portion of the base 56 of the front insert 52 disposed between the planar portion 118 and respective first and second elements 102, 104.

As depicted in FIGS. 3A and 3B, located at the rear 107 of each of the first and second elements 102, 104, are rear cassette retainers 128. The rear cassette retainers 128 include a base extension 129. The base extension 129 is generally square shaped. The base extension 129 extends from each of the first and second elements 102, 104. A portion of the base extension 129 may extend beyond the first side 103 of the first element 102 and the second side of the second element 104, respectively. A second portion of the base extension 129 may extend beyond the rear 107 portion of each of the first and second elements 102, 104. The base extension 129 may be generally planar with the base 100.

A vertical portion 130 extends generally perpendicular from each of the base extensions 129 of the rear cassette retainer 128. The vertical portion 130 is generally rectangular. Each of the vertical portions 130 includes two openings, an upper opening 131 and a lower opening 132. The upper and lower openings 131, 132 may be any shape that is configured to interact with a rear post of a cassette as described below. A stop 136 situated approximately midway along the length of the vertical portion 130, and between the upper and lower openings.

The stop 136 includes an extension 138 and an engagement portion 140. The extension 138 is connected to the stop 136 at a first end. The extension 138 extends laterally from the vertical portion 130 in an angled direction towards the front 105 and center of the base 100. The engagement portion 140 is disposed at a second end of the extension 138. The engagement portion 140 extends from the second end of the extension 138 towards the front 105 of the rear insert 54. The engagement portion 140 is configured to contact a cassette installed in the rear insert 54 as described fully below.

At the lower most portion of the vertical portion 130 is a lower flange 134. The lower flange 134 extends from the vertical portion 130 at approximately a right angle inwards towards a center line of the base 100. The lower flange 134 is disposed below the base extension 129 in a spaced parallel relationship. The lower flange 134 may be generally the same size and shape as the base extension 129. The area created between the base extension 129 and lower flange 134 is configured to accommodate two cassettes in a stacked relationship when installed in the rear insert 54.

As referred to above and depicted in FIGS. 3A and 3B, the first and second elements 102, 104 are joined by the connecting element 106. The connecting element 106 is generally rectangular with a first end connected to the first element 102 and a second end connected to the second element 104. The connecting element 106 is generally planar with the first and second elements 102, 104. Disposed along the length of the connecting element 106 is a connector 142.

The connector 142 is joined to the connecting element 106 at a first end. The connector 142 resides between the first and second elements 102, 104. The location of the connector 142 on the connecting element 106 creates engagement channels 143 between the connector 142 and the first element 102 and between the connector 142 and second element 104.

The connector 142 extends from the connecting element 106 towards the front 105 of the rear insert 54. The connector 142 is tapered as it extends towards the front 105 of the rear insert 54. At the end of the connector 142 is a fold 148. At the fold 148, a portion of the connector 142 is folded over onto itself. The fold adds strength and creates a lip 149. The lip 149 abuts a cut-out 150 in the connector 142. The cut-out 150 is a through opening in the connector 142. The cut-out 150 is configured to interact with the snap finger 62 of the front insert 52.

Lastly, as depicted in FIGS. 3A and 3B on the side of the connecting element 106 opposite the connector 142, is a pre-load finger 152. The pre-load finger 152 is inset into the connecting element 106, extending only slightly beyond the outer edge of the connecting element 106. The pre-load finger 152 is angled slightly away from the top of the base 100. The pre-load finger 152 is configured to provide a force against the base 56 of the front insert 52. The pre-load finger 152 acts to push the base 100 of the rear insert 54 away from the base 56 of the front insert 52.

Figure 5B:
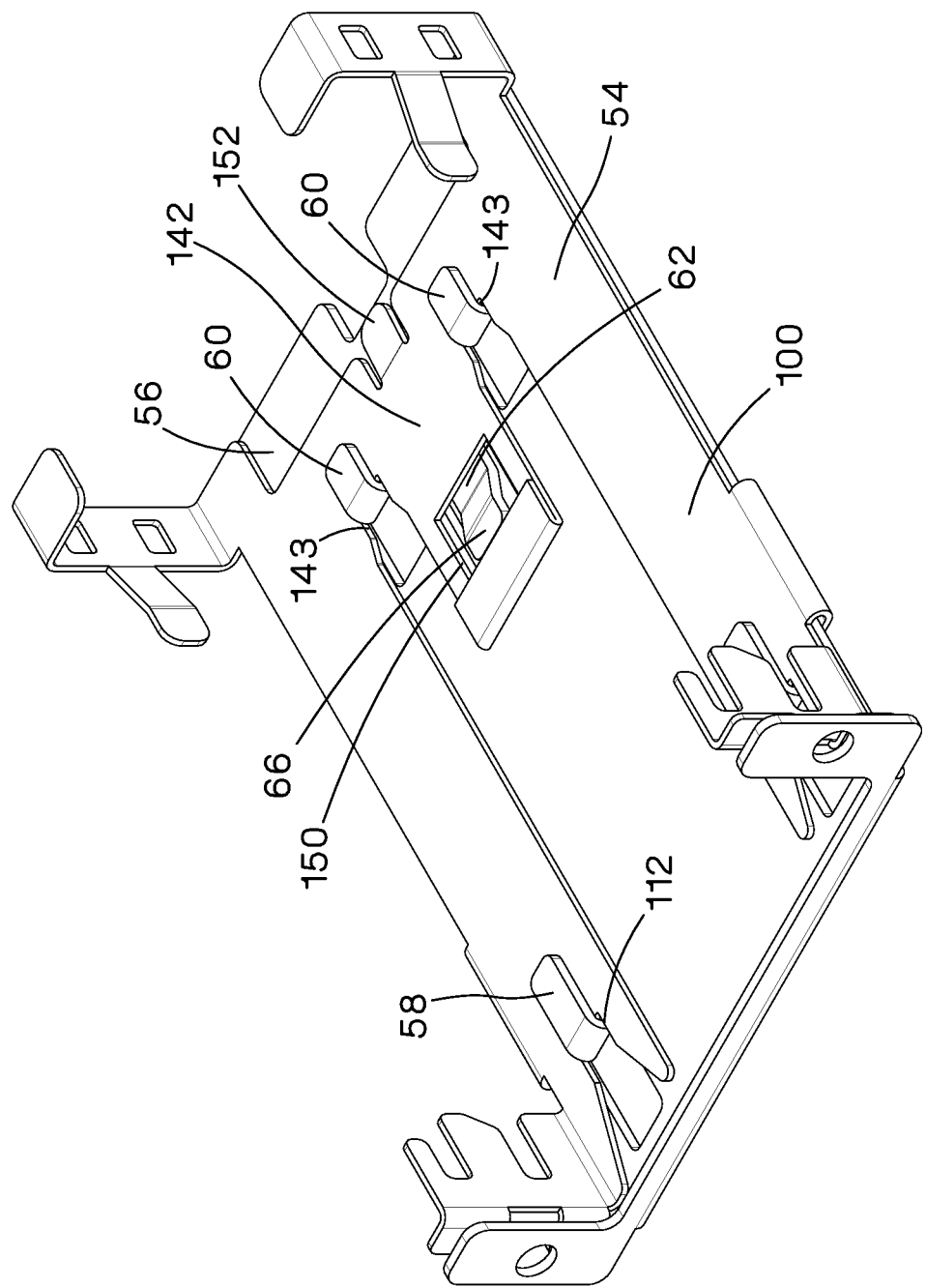
FIG. 5B depicts an underside perspective view of the cassette adapter of FIG. 1.

FIGS. 5A and 5B depict the front insert 52 and rear insert 54 assembled together to form the cassette adapter 50. FIG. 5A depicts the cassette adapter 50 in an installation orientation, whereas FIG. 5B depicts the underside of the cassette adapter 50. To install the rear insert 54 to the front insert 52, the front 105 of the rear insert 54 may be aligned with the rear 59 of the front insert 52. Further, the first side 103 and second side 109 of the rear insert 52 may be aligned with the first side 61 and second side 63 of the front insert 52, respectively. The rear insert 54 may then be slid towards the front 57 of the front insert 52.

As depicted in FIG. 5A, the base 56 of the front insert 52 is retained within each of the two slots 119 formed from the retaining guides 114. During assembly, the retaining guides 114 properly align first and second elements 102, 104 of the rear insert 54 with the front insert 52.

As depicted in FIGS. 5A and 5B, the extended and shortened helms 58, 60 engage the rear insert 54. The catches 75 of the extended helms 58 mate within the engagement cut-outs 112 of the first and second elements 102, 104. The extended helms 58 may be slightly smaller in width than the width of the engagement cut-outs 112 to allow the mating connection. The catches 80 of the shortened helms 60 mate within the engagement channels 143 of the first and second elements 102, 104. The shortened helms 60 may be slightly smaller in width than the width of the engagement channels 143 to allow the mating connection. The extended and shortened helms 58, 60 facilitate a connection of the front insert 52 to the rear insert 54.

During assembly, as the rear insert 54 slides forward, the extended helms 58 mate within the engagement cut-outs 112 of the first and second elements 102, 104 and the shortened helms 60 of the front insert 52 mate within the engagement channels 143 of the first and second elements 102, 104.

Further, as the rear insert 54 slides forward, the snap finger 62 of the front insert 52 flexes and travels over the fold 148 of the connector 142. As the rear insert 54 continues to travel forward, the engaging portion 66 of the snap finger 62 drops into the cut-out 150. As depicted in FIG. 5B, the engaging portion 66 of the snap finger 62 is retained within the cut-out 150. The retention of the snap finger 62 within the cut-out 150 works to maintain the rear insert 54 in place when installed into the patch panel 51 and prevent the rear insert 54 from sliding out from the front insert 52.

The pre-load finger 152, depicted in FIGS. 5A and 5B, further provides a connection between the front insert 52 and rear insert 54. The pre-load finger 152 acts a force against the base 56 of the front insert 52. The angled portion enacts a force to push the base 100 of the rear insert 54 away from the base 56 of the front insert 52.

The cassette adapter 50 as depicted in FIGS. 5A and 5B, is in an interlocked position. The above described interactions and connections between the front insert 52 and rear insert 54 maintain the front insert 52 and rear insert 54 in a fixed relationship. The rear insert 54 is supported by the front insert 52. The front insert 52 has roughly the same footprint at the rear insert 54. In general, the rear insert 54 mates to the underside surface 67 of the front insert 52.

The front insert 52 may also be disconnected from the rear insert 54. A user may push up on the engaging portion 66 of the snap finger 62, forcing the engaging portion 66 out of the cut-out 150 of the connector 142 of the rear insert 54. A user may then slide the rear insert 54 away from the front 57 of the front insert 52. The rear insert 54 may be slid until the extended helms 58 disengage with the cut-outs 112 and the shortened helms 60 disengage with the engagement channels 143. The rear insert 54 may then be removed from the front insert 52.

Figure 6A:
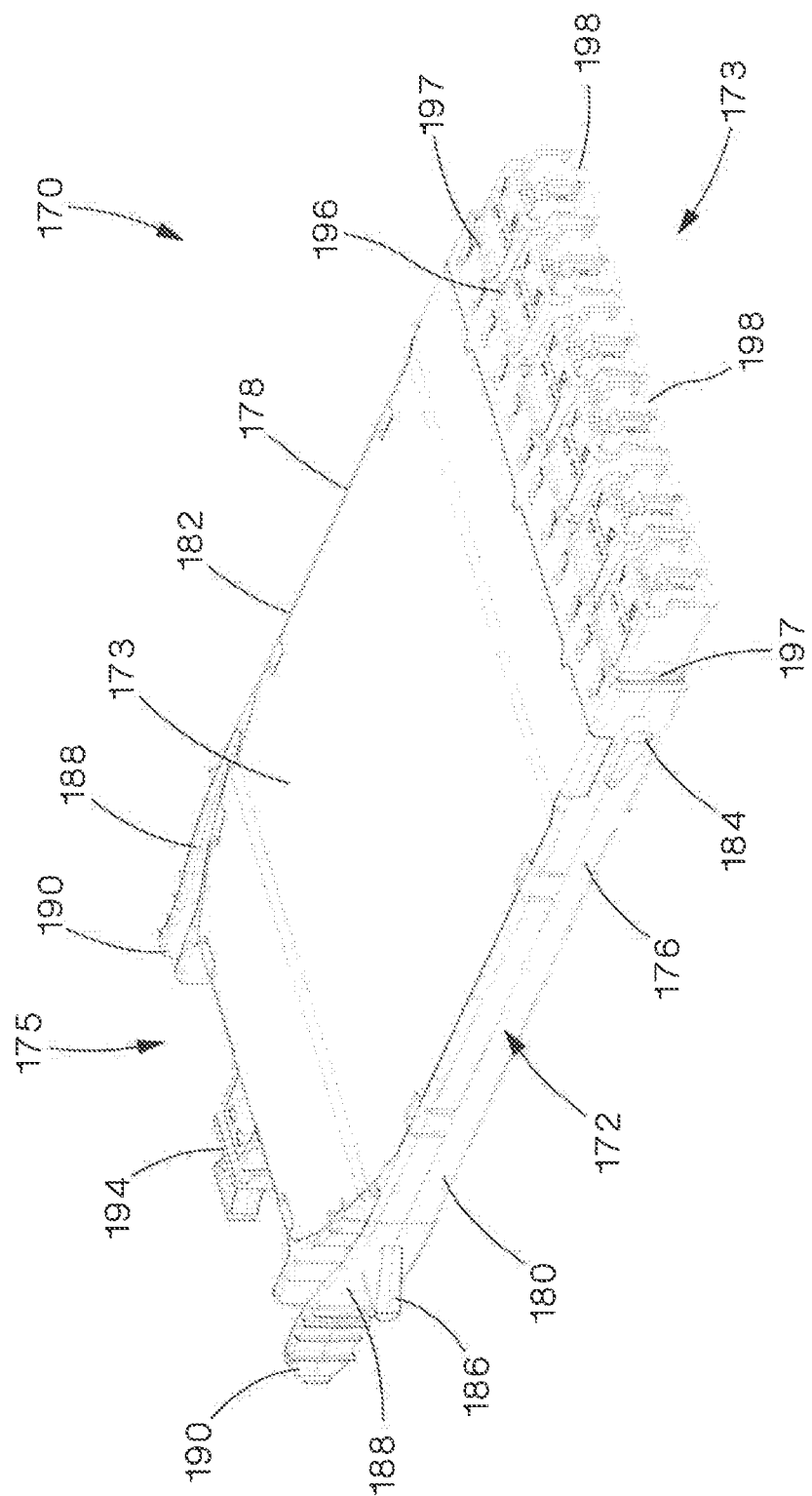
FIG. 6A depicts a top isometric view of an example cassette.
Figure 6B:
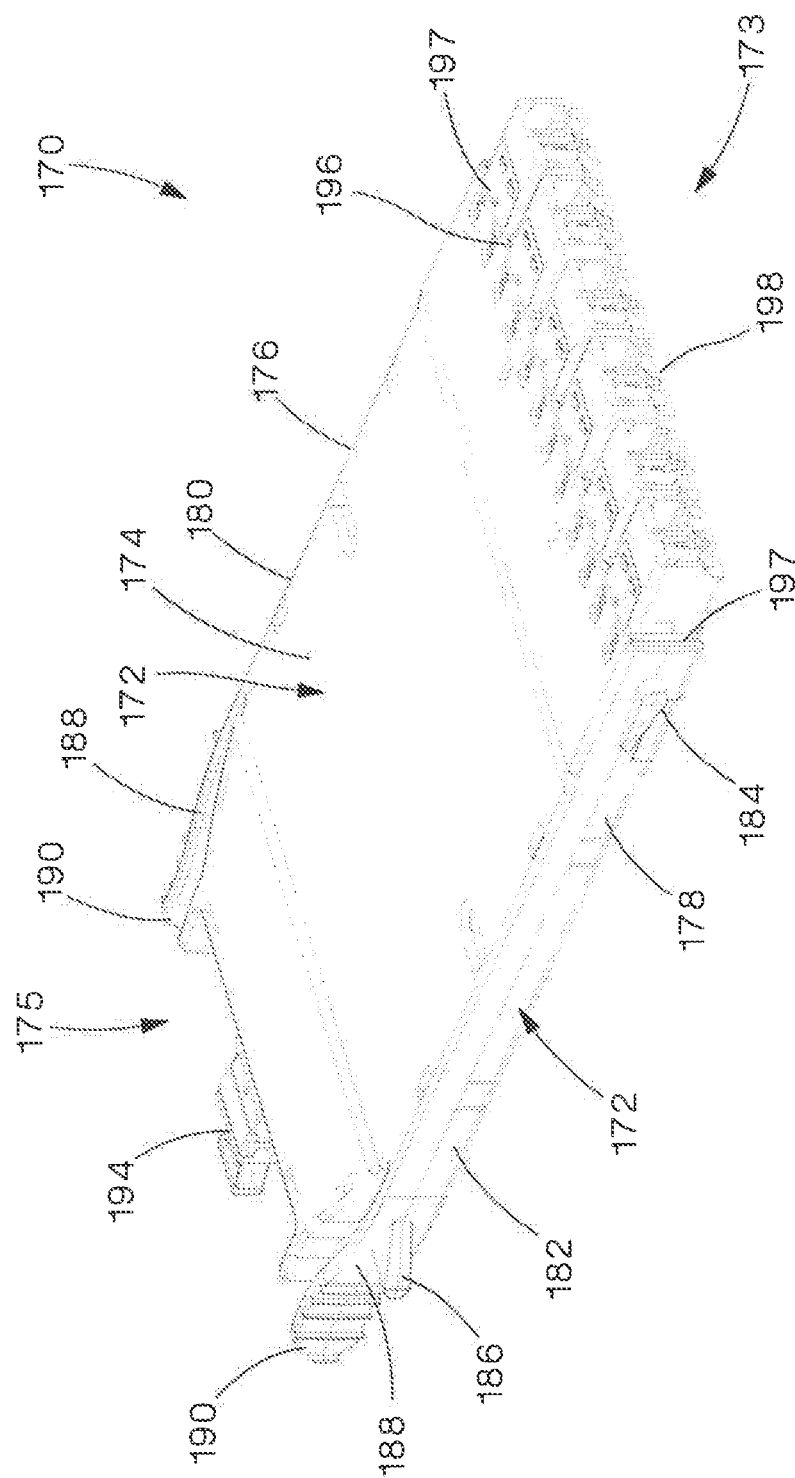
FIG. 6B depicts a bottom isometric view of the cassette of FIG. 6A.

FIGS. 6A and 6B depict an embodiment of an exemplar cassette for use within the invention Cassette 170 may have a cassette body 172. The cassette body 172 is generally rectangularly shaped, and includes a base 174, front 173, back 175, first side 176, and second side 178. The first side 176 includes a first wall 180 that is attached at generally a right angle to the base 174. The second side 178 includes a second side wall 182 that is attached at generally a right angle to the base 174. The cassette 170 may also include a cassette cover 173 which extends parallel to the base 174 of the cassette body 172 from the first wall 180 to the second wall 182.

Further depicted in FIGS. 6A and 6B, cassette 170 may have cassette front posts 184 on each of the first and second sides 176, 178. The cassette front posts 184 extend out at generally a right angle from each the first wall 180 and second wall 182. The cassette front posts 184 are configured to interact with the upper and lower slots 152, 154 of the rear insert 54.

The cassette 170 may have cassette rear posts 186 on each of the first and second sides 176, 178. The cassette 170 may have a cassette rear post release latches 188 on each of the first and second sides 176, 178 that includes a protrusion 190. The cassette rear post release latches 188 are configured such that when the protrusion 190 is depressed, the release latches 188 act on the cassette rear posts 186 to withdraw the cassette rear posts 186 inward. The cassette rear posts 186 are configured to interact with the upper and lower apertures 131, 132 of the rear insert 54.

As depicted in FIGS. 6A and 6B, the cassette 170 may also include a MPO adapter 194 and a front LC mounting face 196. The MPO trunk adapter 194 is located at the rear 175 of cassette body 172. The LC mounting face 196 is located at the front 173 of the cassette body 172. The LC mounting face 196 includes mounting openings 197. The mounting openings 197 may be used to mount LC adapters 198.

It is contemplated that other cassettes may be used within the cassette adapter such as those cassettes described in U.S. application Ser. No. 14/848,757, which is incorporated by reference in its entirety in this application. It is further contemplated that different adapters may be utilized within the cassette 170, such as MPO-LC, MPO-MPO, MPO-LC Splice Cassette, and a MPO Fiber Access Panel.

Figure 7:
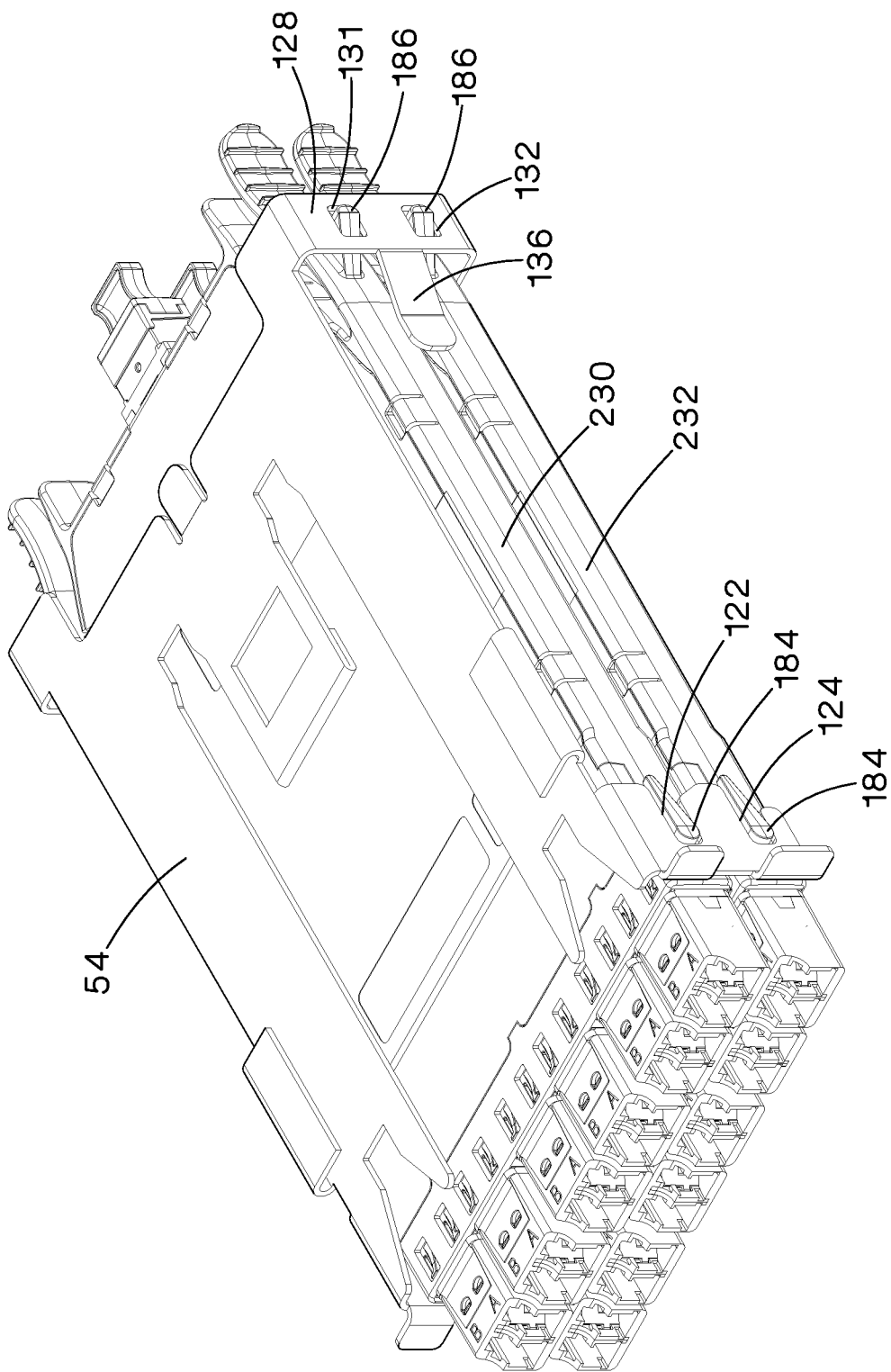
FIG. 7 depicts the rear insert of FIG. 5A with a pair of cassettes of FIG. 6A installed therein.

FIG. 7 depicts the rear insert 54 with two installed cassettes. As depicted in FIG. 7, an upper cassette 230 and a lower cassette 232 are mounted into the rear insert 54. The depicted upper and lower cassettes 230, 232 may be the same cassette 170 as depicted in 6A and 6B. The upper cassette 230 mounts to an upper portion of the rear insert 54. The lower cassette 232 mounts to a lower portion of the rear insert 54.

A user may install the cassette 170 by inserting the cassette front posts 184 of the upper cassette 230 into the upper slot 122 of the rear insert 54. A user may also depress the protrusion 190 of the upper cassette 230, causing the release latches 188 act on the cassette rear posts 186 to draw the cassette rear posts 186 inward. The cassette rear posts 186 of upper cassette 230 may then be inserted into the upper aperture 131 within the vertical rear cassette retainer 128.

Once installed, as depicted in FIG. 7, the cassette front posts 184 of the upper cassette 230 are retained within the upper slot 122 of the rear insert 54. The cassette rear posts 186 of the upper cassette 230 are retained within the upper aperture 131 within the vertical rear cassette retainer 128 of the rear insert 54.

Similarly, the cassette front posts 184 of the lower cassette 232 are installed and retained within the lower slot 124 of the rear insert 54 as described above. The cassette rear posts 186 of the lower cassette 232 are also installed and retained within the lower aperture 132 within the vertical rear cassette retainer 128 of the rear insert 54 as described above.

Further depicted in FIG. 7, the stop 136 engages the two cassettes 230, 232 in central position within the cassette adapter 50. The stop 136 is configured to restrict excessive motion of the cassettes 170 when installed within the rear insert 54 and to prevent the cassettes 170 from disengaging from the rear insert 54.

A user may also remove the cassettes 170 from the rear insert 54. A user may depress the protrusion 190 of the upper cassette 232, causing the release latches 188 to act on the cassette rear posts 186 to draw the cassette rear posts 186 inward and out of the respective upper aperture 131 or lower aperture 132. The user may slide cassette front posts 184 out of the installed upper slot 122 or lower slot 124 of the rear insert 54. The cassette 170 may then be free of the rear insert 54 and removable.

Figure 8:
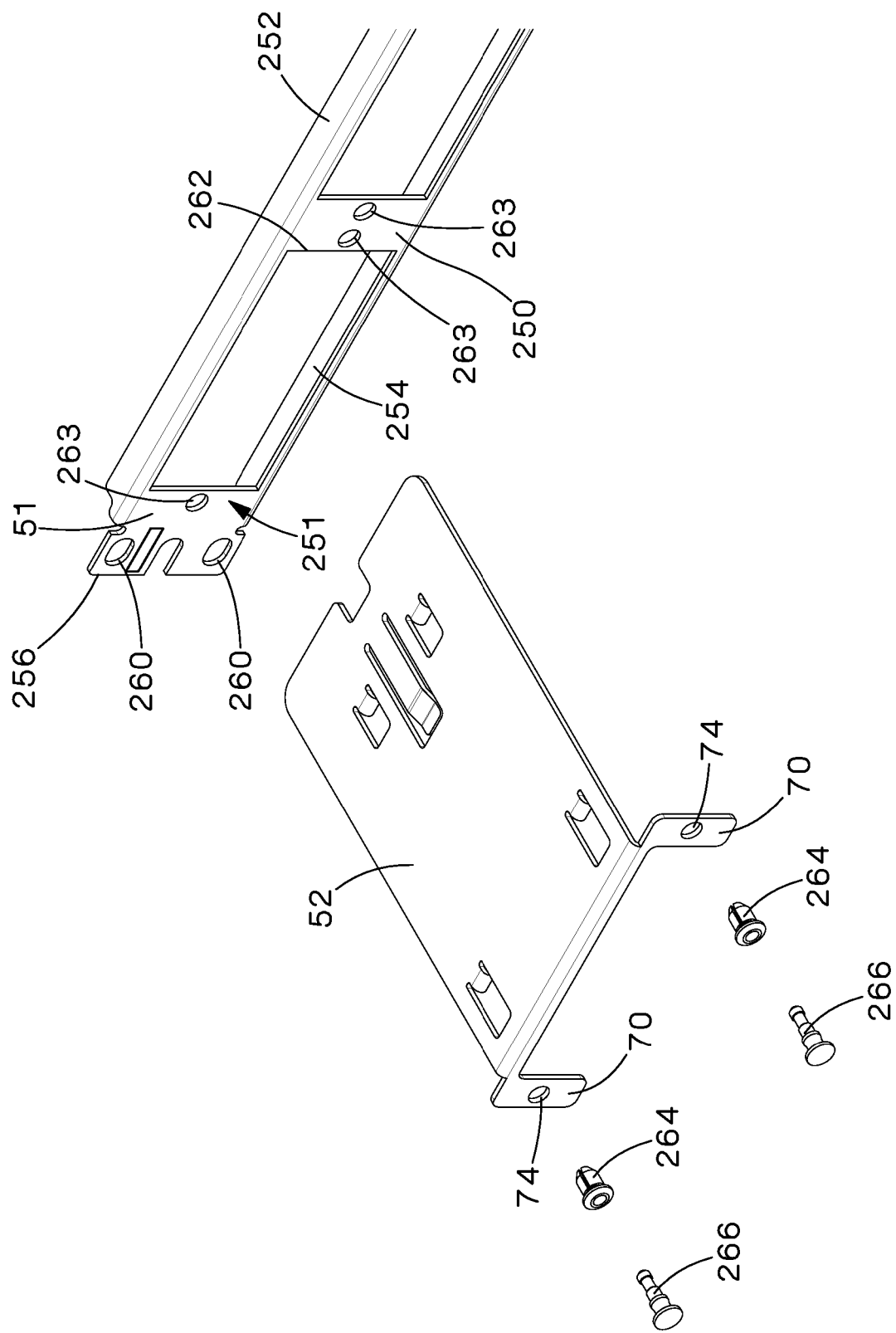
FIG. 8 depicts the patch panel of FIG. 1 and the front insert of FIG. 2A with attachment fasteners.

FIG. 8 depicts the front insert 52 disposed for installation into one example of a patch panel 51. The patch panel 51 depicted in FIG. 8 is a 1 RU patch panel. The patch panel 51 includes a face plate 250, top side wall 252, and bottom side wall 254. The top side wall 252 and bottom side wall 254 extend along a respective top and bottom edge of the face plate 250. The top and bottom side walls 252, 254 being configured to reinforce the face plate 250. The face plate 250 includes an exterior surface 251 that faces the exterior of the rack.

Figure 9:
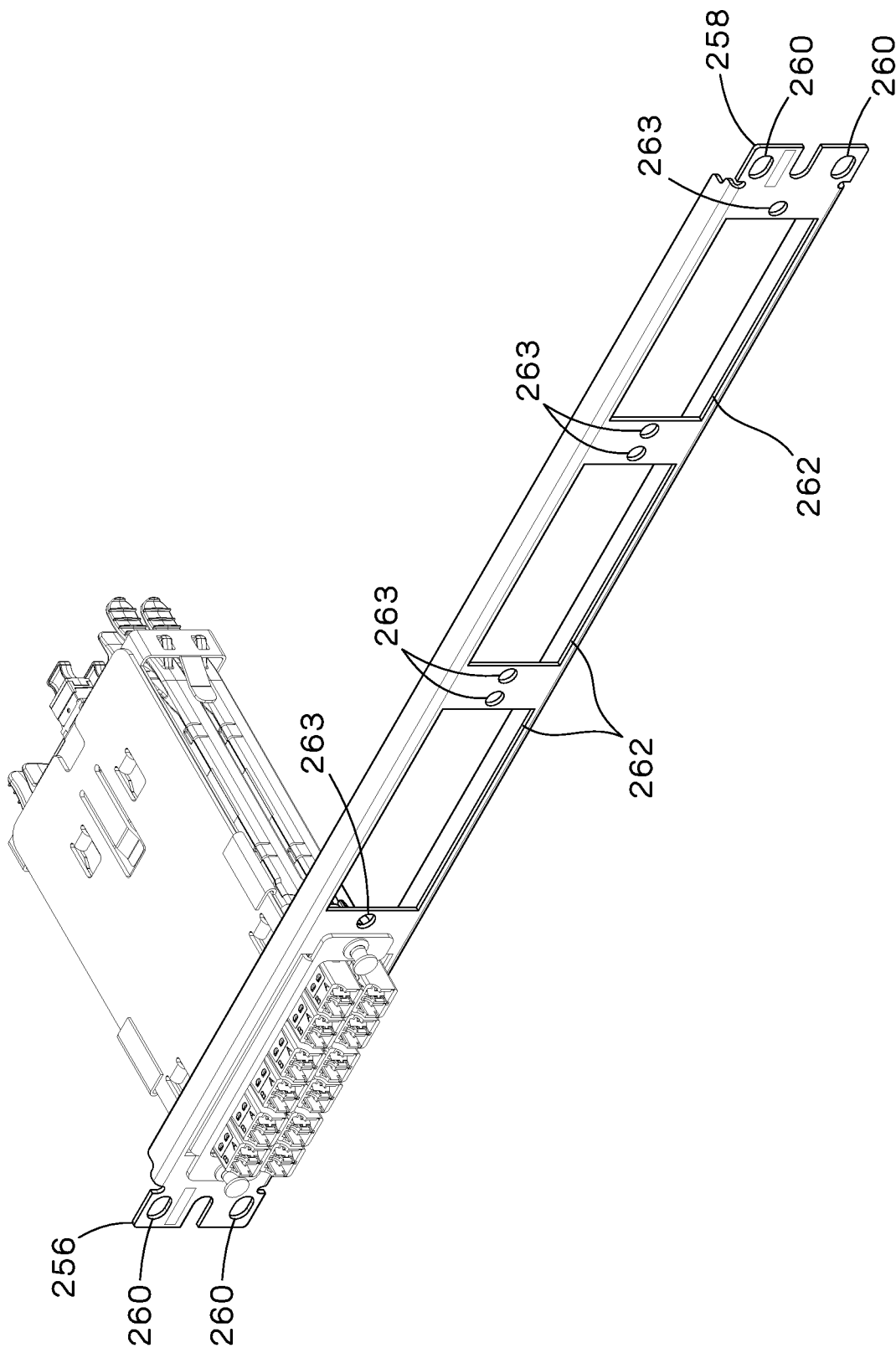
FIG. 9 depicts the patch panel and cassette adapter of FIG. 1 with a pair of cassettes of FIG. 6A installed therein.

As depicted in FIGS. 8 and 9, the face plate 250 is generally rectangular. The face plate 250 includes a first end 256 and a second end 258. The first end 256 and second end 258 are configured to overlay rails of a rack for attachment to the rack. At each of the first and second ends 256, 258 are attachment openings 260. The attachment openings 260 are configured to accept a fastener to attach the patch panel 51 to a rack. Any suitable fastener may be used to secure the patch panel 51 to a rack.

The face plate 250 depicted in FIGS. 8 and 9 includes panel attachment openings 262. The panel attachment openings 262 are generally rectangular and sized and shaped to accept at least the front insert 52 of the adapter 50. Disposed on each side of each of the panel attachment 262 are insert attachment openings 263. The insert attachment openings 263 are configured to mount the cassette adapter 50 to the patch panel 51. The cassette adapter 50 may mount to the patch panel 51 using a fastener 261. The fastener 261 is inserted through the front insert 52 and through the attachment openings 263. The fastener 261 may include a grommet 264 and plunger 266 fastener such as a Nylatch Two-Piece Panel Fastener.

The grommets 264 and plungers 266 are of a standard grommet/plunger configuration utilized as a fastener. The grommets 264 and plungers 266 are configured to attach the front insert 52 to the patch panel 51. The grommets 264 are of a similar size and shape as the openings 74 in the front frame 70 of the front insert 52 and the insert attachment openings 262 in the patch panel 51. When the grommets 264 are inserted into the respective openings 74 of the front insert 52 and the insert attachment openings 263 in the patch panel 51, they loosely retain the front frame 70 to the patch panel 51. The plungers 266 are configured to be inserted into an opening of the grommet 264. Inserting the plunger 266 into the grommet 264 expands the grommet 264 and removably attaches the front insert 52 to the patch panel 51. Any other suitable fastener may be utilized to removably secure the front insert 52 to the patch panel 51.

A user may insert the front insert 52 of the cassette adapter 50 into one of the panel attachment openings 262 in the patch panel 51. The front insert 52 may be installed such that the front frame 70 of the front insert 52 abuts the exterior surface 251 of the patch panel 51. The grommets 264 are then inserted into each of the corresponding openings 74 of the front insert 52 and the insert attachment openings 263 of the patch panel 51. The plungers 266 are then inserted into each of grommets 264, extending through the front insert 52 and the patch panel 51. The front insert 52 may be installed in this fashion so that the front insert 52 restricts rotation and permanent deflection during use, when connecting and disconnecting a cable to a cassette 170.

The front insert 52 may also be removed from the patch panel 51. To remove the front insert 52, the fastener 261 is removed from the opening 74 of the front insert and the opening 263 of the patch panel 51. With the fastener 261 removed, the front insert 52 may be removed from the patch panel 51.

Figure 10:
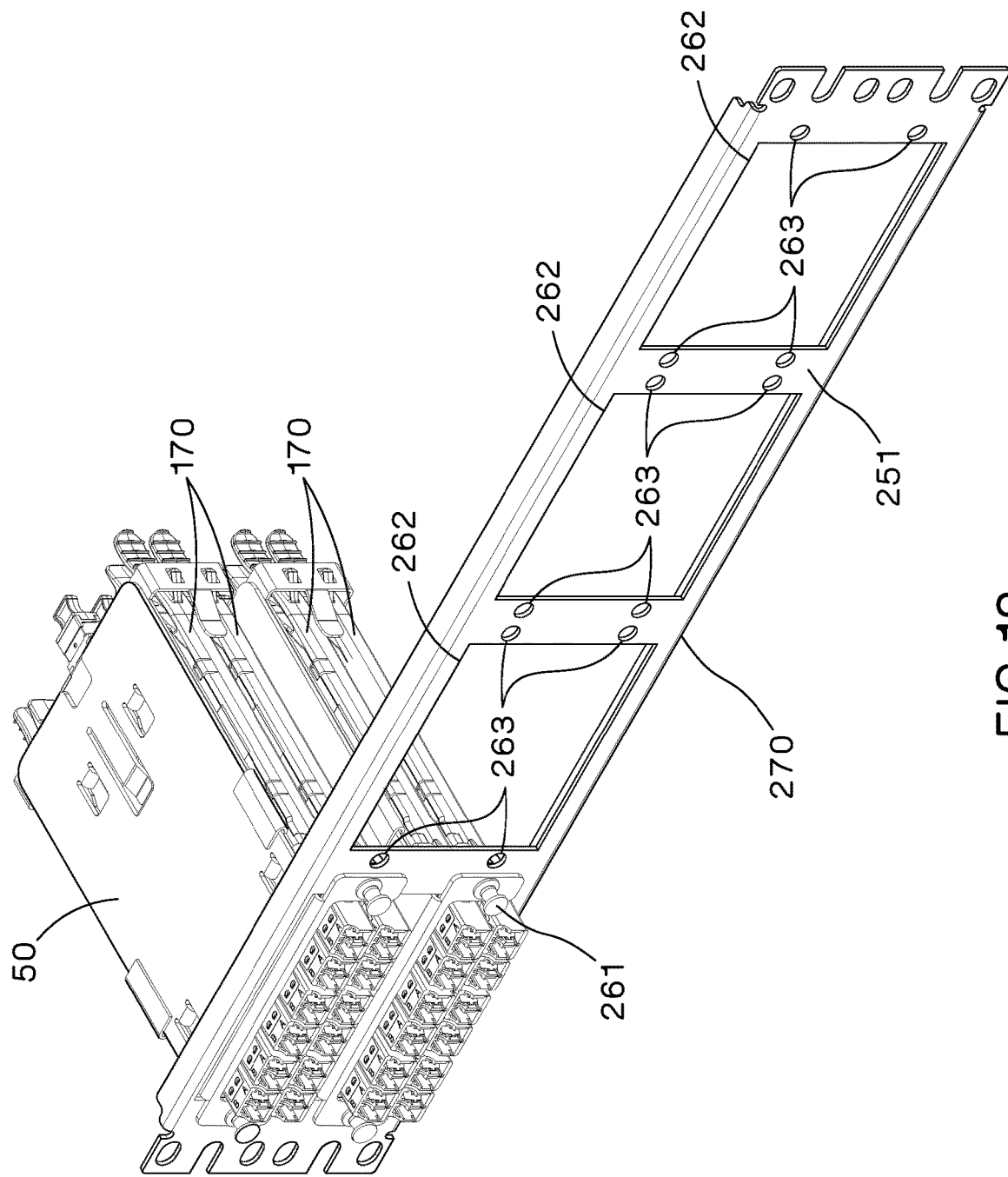
FIG. 10 depicts another example patch panel with two installed cassette adapters of FIG. 1 with a pair of cassettes of FIG. 6A installed therein to each cassette adapter.

FIG. 10 depicts an alternative configuration of an alternative patch panel 270 configuration. The patch panel 270 of FIG. 10 depicts two cassette adapters 50 and cassettes 170 installed in a 2 RU patch panel. In this configuration the cassette adapter 50 and attached cassettes 170 may be installed one over another within the same attachment opening 262 of the patch panel 270. Patch panel 270 is configured as the previous patch panel 50, the difference being the 2 RU patch panel attachment openings 262.

The rear insert 54 is configured to accept the cassettes 170 with the cover 173 in the upward orientation or the base 174 in the upward orientation. Further, cassettes with different configurations are contemplated to be installed within the cassette adapter of the present invention. The rear insert 54 and installed upper cassette 230 and lower cassette 232 of FIG. 7, are configured to be inserted into the front insert 52 for installation into the patch panel 51.

The above example of the cassette adapter 50 depicted in FIGS. 1-10 is configured to install cassettes 170 into the patch panel within a rack. A user may install the cassette 170 via the cassette adapter 50 into a new or existing patch panel 51, 270 within a rack system. The adapter 50 may be installed into a 1 RU, 2 RU or greater patch panel. It is also contemplated that the cassette adapter 50 may attach to other patch panel configurations for installation of a cassette within a rack. Once the cassette adapter 50 with cassettes 170 is installed within a patch panel, the cassette may be connected to the system or equipment with cables (not shown) for use in the data rack.

Depicted in FIGS. 11-15 is another example of the cassette adapter of the present invention. The cassette adapter 300 may be configured to be used with the cassette 170 discussed above or other cassette configurations. The cassette adapter 300 is configured to install a cassette 170 to an alternative patch panel where the cassette 170 is not configured to mount directly to the patch panel.

Figure 11:
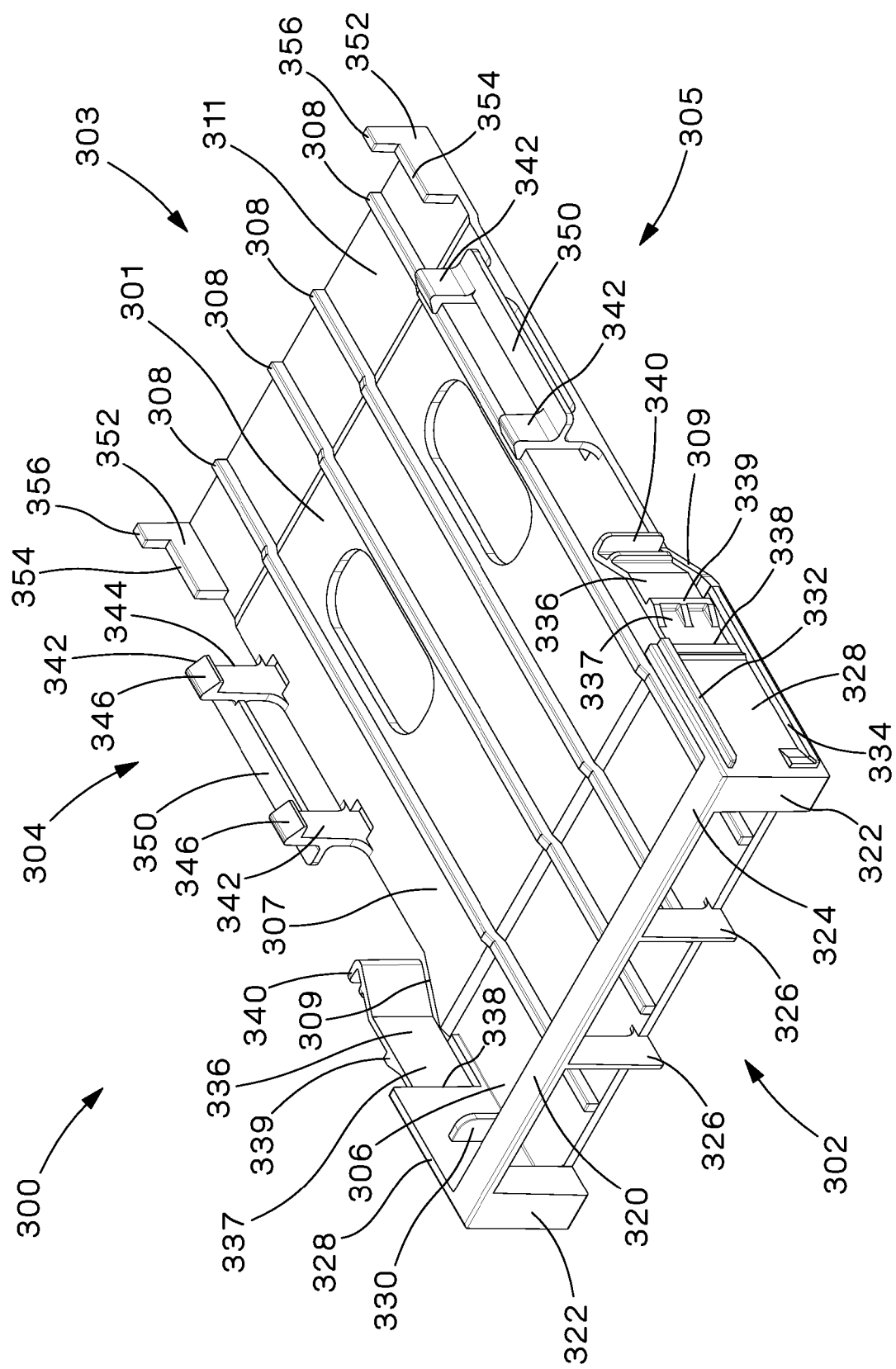
FIG. 11 depicts another example cassette adapter.

The cassette adapter 300 depicted in FIG. 11 includes a base 301. The base 301 includes a front 302, a rear 303, a first side 304, and a second side 305. The base 301 is generally rectangular. The base 301 may be formed to include a first portion 306, second portion 307, and a third portion 311.

The first portion 306 may be at the front 302 of the base 301. The third portion 311 may be at the rear 303 of the base 301. The second portion 307 may be disposed between the first portion 306 and third portion 311. The first and third portions 306, 311 may be generally planar. The second portion 307 may reside above the first and third portions 306, 311. It is also contemplated that the first, second, and third portions 306, 307, & 311 may reside on the same plane or be of any configuration to correspond with a base of a cassette to be inserted therein.

At the connection between the first portion 306 and the second portion 307, the second portion 307 may be of a similar width as the first portion 306. The second portion includes two chamfers 309. The chamfers 309 are located on the second portion 307, adjacent the first portion 306 and is on each of the first and second sides 304, 305 of the base. The chamfers 309 reduce the width of the second portion 307. The third portion 311 may be of a similar width as the second portion 307.

As depicted in FIG. 11, body ribs 308 extend across the length of the base 301. The body ribs 308 are configured to provide strength down the length of the base 301. The body ribs 308 are configured to enable the cassette adapter 300 to tolerate higher loads.

Referring to the first portion 306 of the base 301 as depicted in FIG. 11, a front frame 320 is disposed at the front 302 of the base 301, along an edge of the first portion 306. The front frame 320 includes posts 322 disposed at the first and second sides 304, 305 of the first portion 306. The posts 322 extend vertically up from the base 301. The posts 322 are generally rectangular. A top bridge 324 may extend horizontally between the two posts 322. The top bridge 324 connects the two posts 322. Support ribs 326 may extend down from the top bridge 324 to the first portion 306. The support ribs 326 are configured to support the top bridge 324.

Connected to the posts 322 on each of the first and second side 304, 305 is a mounting portion including side wall 328. The side wall 328 extends along the each of the first and second sides 304, 305, approximately half the length of the first portion 306. The side wall 328 extends up from the first portion 306 of the base 301 at generally a right angle. Located on an outside portion of each of the side walls 328 is an upper rail 332 and a lower rail 334.

The upper rail 332 extends the length of the upper portion of the side wall 328. The lower rail 334 extends along the length of the side wall 328 and continues along the entire first portion 306. The upper rail 332 and lower rail 334 are configured to engage a channel in a backside of a patch panel to attach the adapter 300 to the patch panel.

Located on an internal portion of each of the side walls 328 is a front tower 330. The front tower 330 extends up the side wall 328 from the base 301. The front tower 330 is configured as a stop to prevent the cassette 170 from moving towards the front 302 farther than the location of the front tower 330. The front tower 330 fixes the front 302 location of the cassette 170 and corresponding elements.

At the end of each of the two side walls 328 opposite the posts 322, is a release latch 336. The release latch 336 is a cantilever beam 337 having a hinge point 338, a latch tab 339, and a depressing tab 340. The release latch 336 extends from the side wall 328 towards the rear 303 of the base 301 extending above a portion of the first portion 306 and the second portion 307. As depicted in FIG. 11, the release latch 336 roughly follows a parameter of the first and second sides 304, 305, including the chamfer 309 of the second portion 307.

The latch tab 339 may be a protrusion from the cantilever beam 337 of the release latch 336. When the depressing tab 340 is depressed inward, the latch tab 339 will move inward because the latch tab 339 is located between the hinge point 338 and the depressing tab 340. The latch tab 339 is configured to engage a lip of a guide latch tab of a patch panel to maintain the cassette adapter 300 in the patch panel.

Referring to the second portion 307 of the base 301 as depicted in FIG. 11, openings 310 may be formed within the base 301. The openings 310 are configured to allow a user to remove a cassette 170 installed within the cassette adapter 300.

Also depicted in FIG. 11, connected to each of the first and second sides 304, 305 of the second portion 307 are latches 342. The latches 342 include a vertical element 344 and a catch 346. The vertical element 344 extends up from the base 301, at generally a right angle. The catch 346 is located on top of the vertical elements 344. The catch 346 may be in the shape of a right triangular prism as depicted in FIG. 11. A link 350 extends between the catches 341 on each of the first and second sides 304, 305 of the base 301. The catch 346 is configured to retain the cassette 170 in the cassette adapter 300 and prevent vertical movement of the cassette 170. The catch 346 may be any shape or configuration sufficient to retain the cassette 170 within the cassette adapter 300.

Lastly, referring to the third portion 311 of the base 301 as depicted in FIG. 11, the third portion 311 includes a latching mechanism defined by a rear tower 352 on each of the first and second sides 304, 305 of the base 301. The rear tower 352 extends up from the third portion 311 of the base 301 at generally a right angle. The rear tower 352 includes a rear post support 354 and a rear post catch 356.

Figure 12:
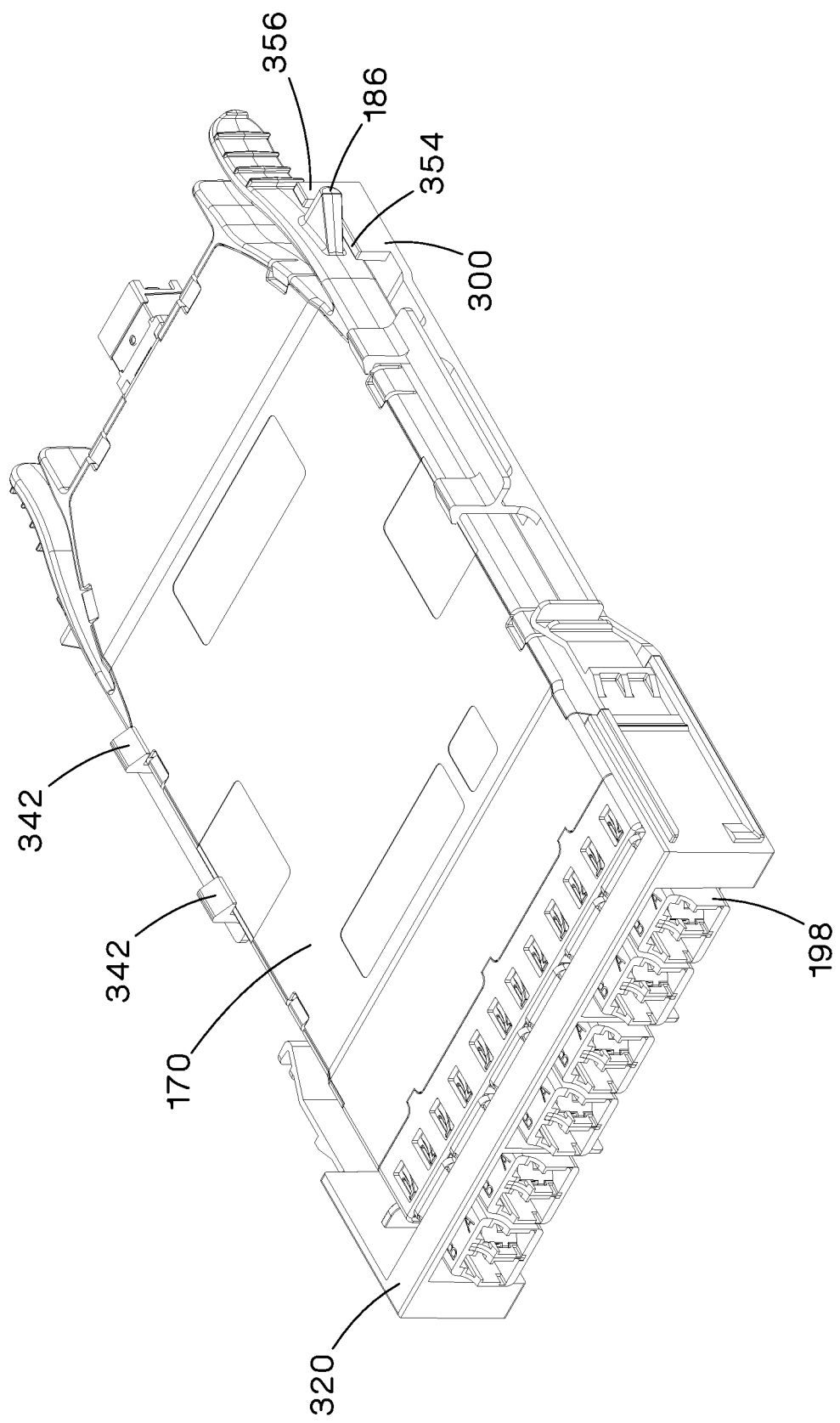
FIG. 12 depicts the cassette adapter of FIG. 11 with the cassette of FIG. 6A installed therein.
Figure 13:
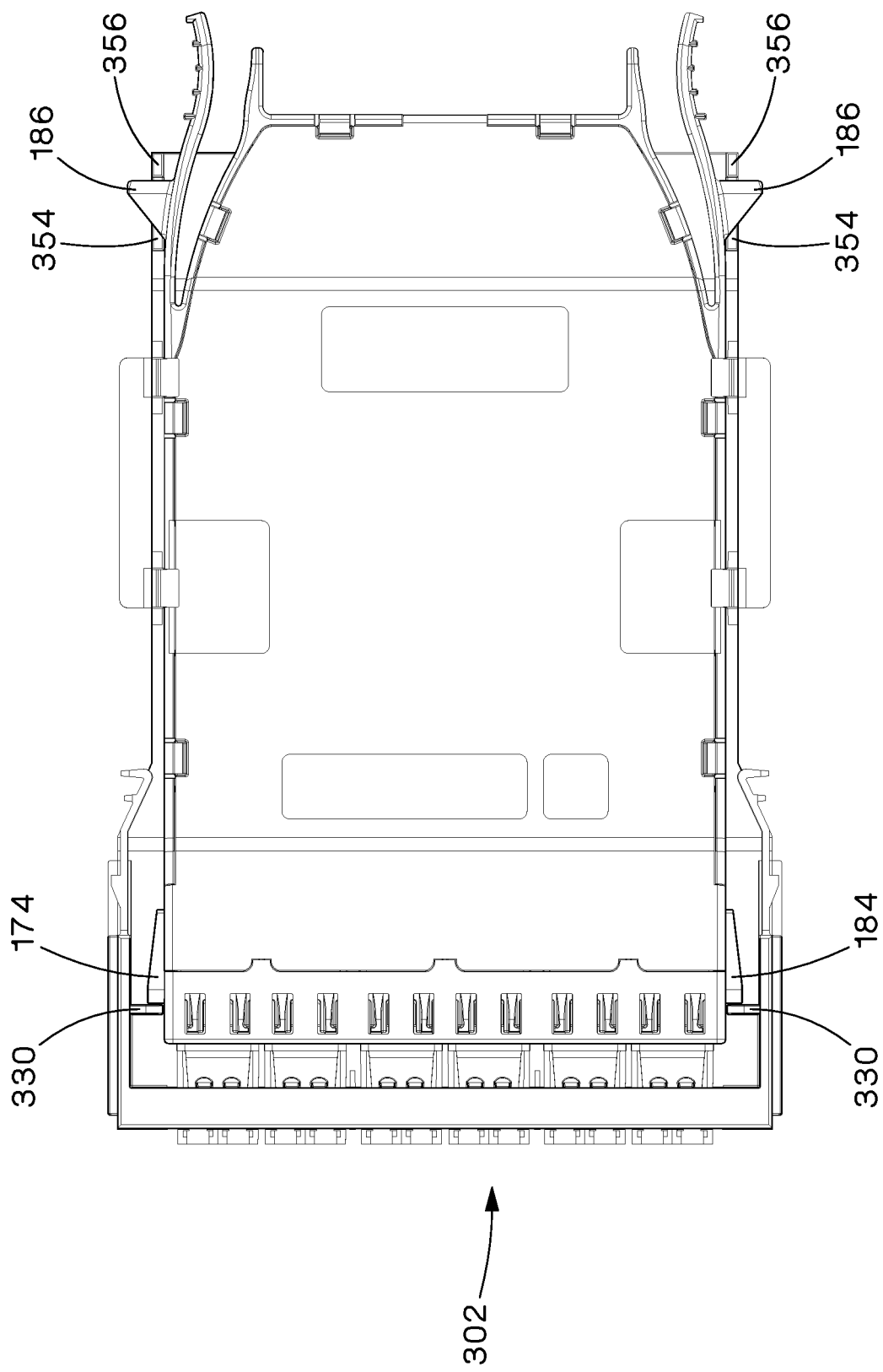
FIG. 13 depicts a top view of the cassette and cassette adapter of FIG. 12.

FIGS. 12 and 13 depict the cassette adapter 300 of FIG. 11 with the cassette 170 as described above in relation to FIGS. 6A and 6B mounted within. The cassette adapter 300 being slightly larger than the cassette 170 to accept the cassette 170.

To install the cassette 170 into the patch panel 400, a user may install the cassette 170 into the cassette adapter 300. The shuttered LC adapters 198 of the cassette 170 are positioned down at an angle with the rear 175 of the cassette 170 being above the front 173. The shuttered LC adapters 198 may be then be slid under the top bridge 324 and through of the front frame 320. The rear 175 of the cassette 170 may then be pushed down into the cassette adapter 170 until the base 174 of the cassette 170 rests upon the body ribs 308 of the base 301 across the first, second, and third portions 306, 307, and 311.

In the installed state, the shuttered LC adapters 198 of the cassette 170 extend through the front frame 320 of the cassette adapter 300. The latches 342 on the first and second sides 304, 305 of the cassette adapter 300 retain the cassette 170 within and prevent vertical movement of the cassette 170. As depicted in FIGS. 12 and 13, the cassette rear posts 186 rest upon the rear post supports 354 and abut the rear post catches 356 of the rear tower 352. The rear post catches 356 prevent the cassette from movement towards the rear 303 of the cassette adapter 300. As depicted in FIG. 13, the cassette front posts 184 abut the front tower 330, preventing the cassette from movement towards the front 302 of the cassette adapter 300.

The cassette 170 may also be removed from the cassette adapter 300. A user may push on the links 350 on each the first side 304 and second side 305 causing the latches 342 to pivot away from the cassette 170. The latches 342 will then clear the cassette 170 and unlatch the catches 346 from the cassette 170. A user may insert an object through the openings 310 of the base 301 of the cassette adapter 300 and push on the cassette 170, forcing the rear 175 of the cassette 170 out of the cassette adapter 300. The user may slide the shuttered LC adapters 198 out from underneath the front frame 320 and remove the cassette 170 from the cassette adapter 300.

Figure 14:
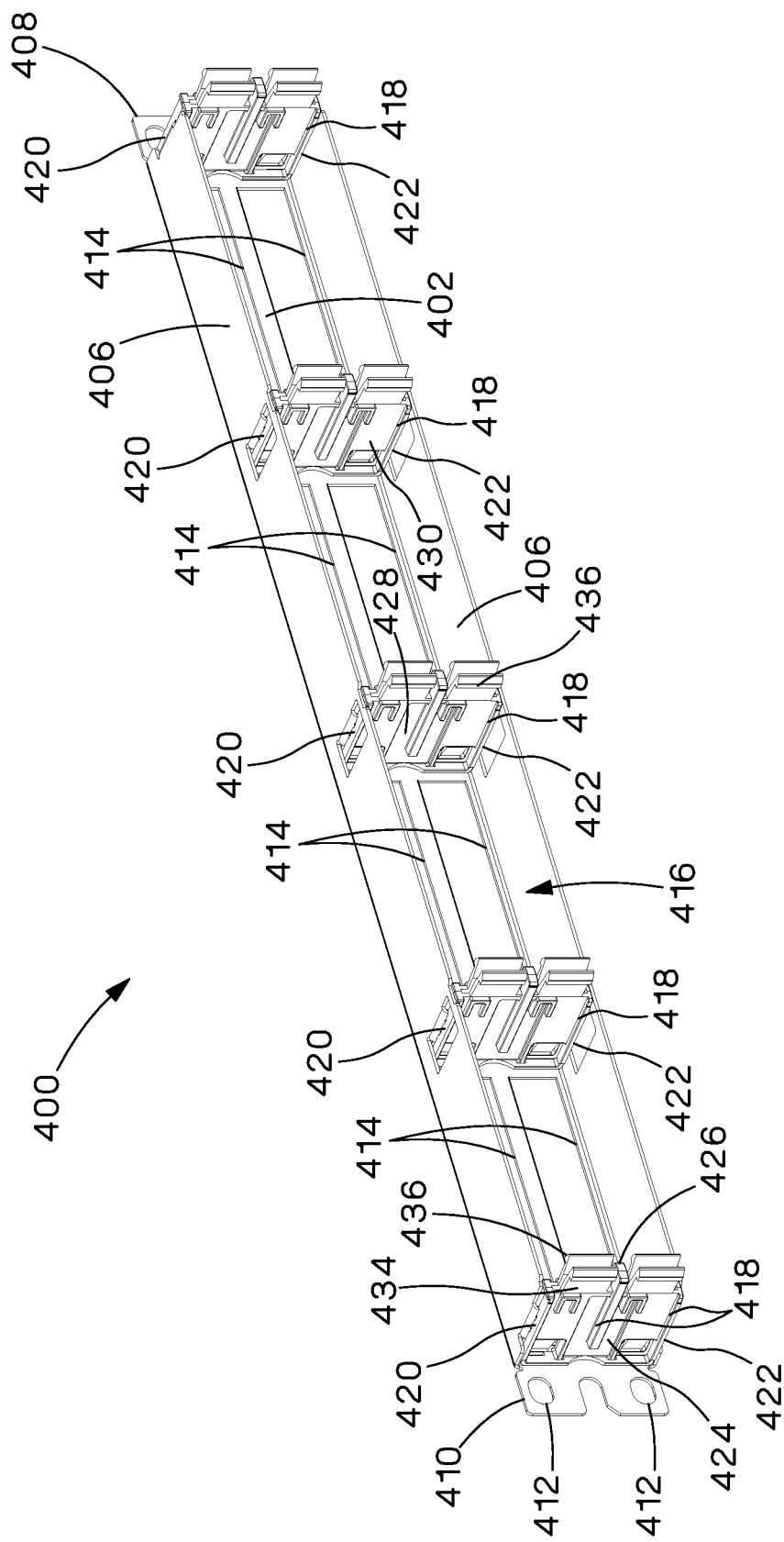
FIG. 14 depicts a rear perspective view of a further example of a patch panel.
Figure 15:
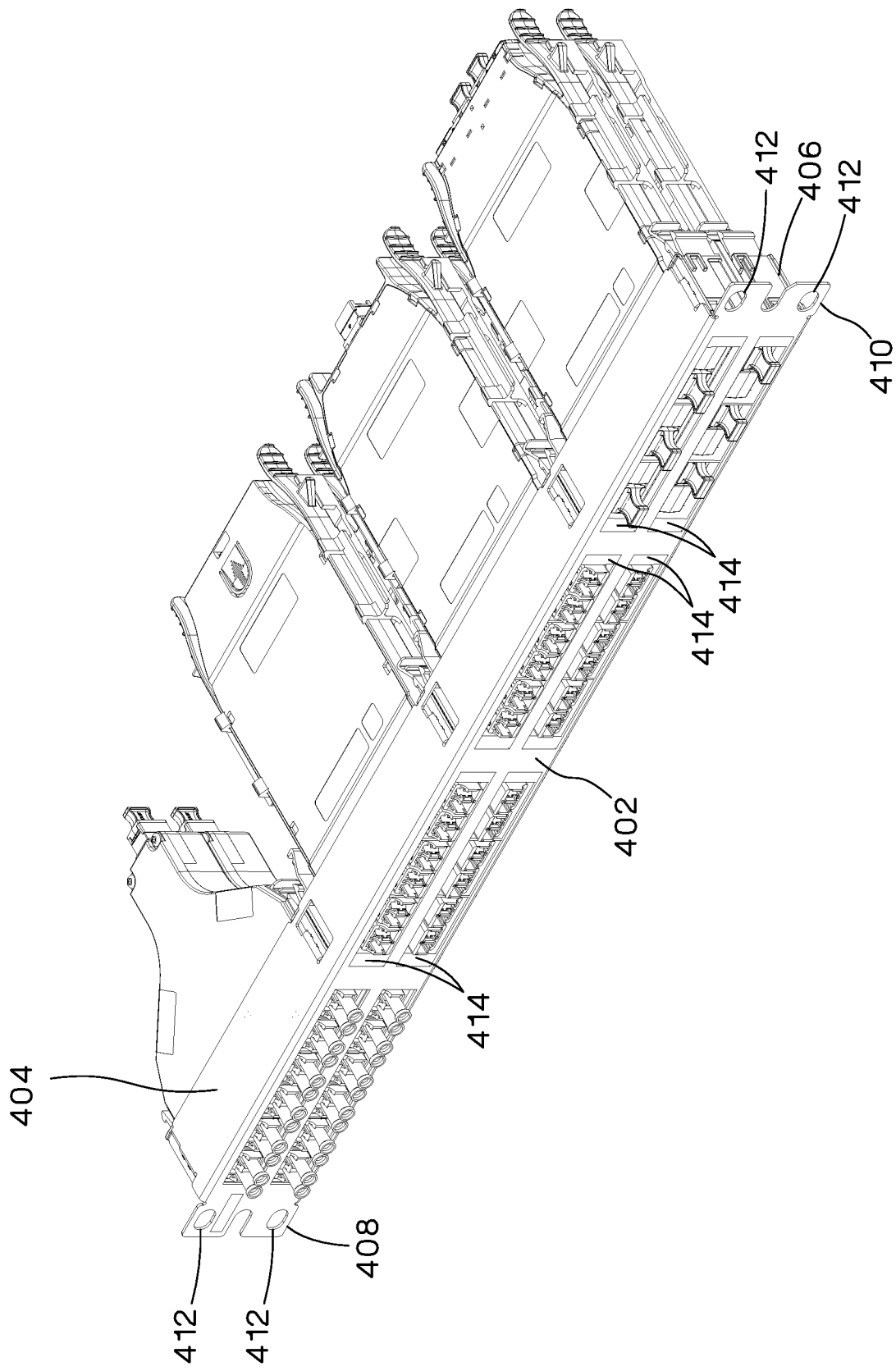
FIG. 15 depicts a plurality of cassettes and cassette adapters of FIG. 12 installed in the further patch panel of FIG. 14.

FIGS. 14 and 15 depict a further example of a patch panel 400 for use with the above described cassette adapter 300. The patch panel 400 of FIGS. 14 and 15 includes a face plate 402, a top 404 and a bottom 406. The top 404 and bottom 406 extend along a respective top and bottom edge of the face plate 402. The top 404 and bottom 406 of the patch panel 400 are slightly shorter than the face plate 402. The top 404 and bottom 406 are generally rectangular with planar surfaces. The top 404 and bottom 406 may be the same size and shape.

The face plate 402 of the patch panel 400 is generally rectangular. The face plate 402 includes a first end 408 and a second end 410. The first end 408 and second end 410 are configured to overlay rails of a data rack for attachment to the data rack. Each of the first and second ends 408, 410 include mounting apertures 412. The mounting apertures 412 are configured to accept a fastener to attach the patch panel 400 to a rack. Any suitable fastener may be used to secure the patch panel 400 to a rack.

The face plate 402 depicted in FIG. 14 includes panel attachment openings 414. The panel attachment openings 414 are generally rectangular and sized and shaped to accept at least a cassette 170 mounted within the cassette adapter 300. As depicted in FIG. 14, the face plate 402 includes two rows of panel attachment openings 414.

As depicted in FIG. 14, the top 404, bottom 406, and face plate 402 of the patch panel 400 form a cavity 416. Within the cavity 416 are guides 418 for affixing the cassette adapter 300 to the patch panel 400. The guides 418 include a top 420, bottom 422, first side 424 and second side 426. The top 420 and bottom 422 of the guide 418 attach to the top 404 and bottom 406 of the patch panel 400. Guides 418 are disposed on each longitudinal side of the panel attachment openings 414. The patch panel 400 depicted in FIG. 14 includes five guides 418, however, additional or fewer guides are contemplated.

On each of the first and second sides 424, 426 of the guides 418 are an upper channel 428 and a lower channel 430. The upper channel 428 aligns with the upper panel attachment opening 414 and the lower channel 430 aligns with the lower panel attachment opening 414. At the end of each of the of the upper and lower channels 428, 430 opposite the face plate 402, are guide latch tabs 434. The guide latch tabs 434 are flexible tabs that extend outwardly from the guides 418. The guide latch tabs 434 include a lip 436 that engages the latch tab 339 of the cassette adapter 300 when installed into the patch panel 400. As depicted in FIG. 14, the upper and lower channels 428, 430 as well as the latch tabs 434 are located on both the first and second sides 424, 426 of the guides 418.

FIG. 15 depicts multiple cassette adapters 400 containing cassettes 170 installed into the patch panel 400. Once the cassette 170 is installed into the cassette adapter 400, the combination may be installed into the patch panel 400. The cassette adapter 300 is aligned with one of the openings 414 of the patch panel 400. The cassette adapter 300 is advanced towards the selected opening 414 such that the upper rail 332 and lower rail 334 of the cassette adapter 300 sidewall 328 engage the guides 418 on each side of the selected opening 414.

In the installed orientation, the upper rail 332 and lower rail 334 of the cassette adapter 300 sidewall 328 are retained within the upper and lower channels 428, 430 of the patch panel 400. As described above, the lip 436 of the guides 418 engages the latch tab 339 of the cassette adapter 300 to fix the cassette adapter 400 within the respective upper or lower channels 428, 430. As depicted in FIG. 15, the cassettes 170 are maintained within the panel attachment openings 414 of the patch panel 400.

Once the cassette adapter 300 with the cassette 170 is installed within a patch panel, the cassette may be connected to the system or equipment with cables (not shown) for use in the data rack.

The cassette adapter 300 is also configured to be removable from the patch panel 400 and for the cassette 170 to be removable from the cassette adapter 300. When the cassette adapter 300 is installed into the patch panel 400, a user may remove the adapter by acting on each depressing tab 340 on each side of the cassette adapter 300, causing the latch tab 339 to move inward and clear the latch tabs 434 of the guides 418. The cassette adapter 300 may then be pulled away from the patch panel 400. The cassette adapter 300 sidewall 328 is slid from upper and lower rails 332, 334 out of the installed upper channel 428 or lower channel 430 of the guides 418.

The above example of the cassette adapter 400 depicted in FIGS. 11-15 is configured to install the cassette 170 into the patch panel 400 as depicted in FIGS. 14 and 15 within a rack. A user may install the cassette 170 via the cassette adapter 300 into a new or existing patch panel within a rack system. The cassette adapter 300 may be installed into a 1 RU, 2 RU, or greater patch panel.

The illustrations of the embodiments described herein are intended to provide a general understanding of the structure of the various examples. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

The invention claimed is:

1. A data rack comprising:
   a first rail and a second rail;
   a patch panel including a first rectangular opening within the patch panel and a second rectangular opening within the patch panel;
   wherein a first side of the patch panel is directly attached to the first rail and a second side of the patch panel is directly attached to the second rail;
   a cassette adapter including a base comprising a first sidewall including a first mounting portion and a second sidewall including a second mounting portion configured to slidably mount and lock to the patch panel, a first tower adjacent the first sidewall at a front end of a first side of the cassette adapter and a second tower at a rear end of the first side of the cassette adapter;
   a cassette configured to be installed in the cassette adapter and including at first protrusion on a first side of the cassette and a second protrusion on the first side of the cassette, wherein movement of the cassette to the front end and the rear end of the cassette adapter is restrained by the first protrusion being disposed against the first tower and the second protrusion being disposed against the second tower; and
   wherein a portion of a front of the cassette extends through the first rectangular opening of the patch panel.

2. The data rack of claim 1, where the cassette adapter further includes a third tower adjacent the second sidewall at a front end of a second side of the cassette adapter and a fourth tower at a rear end of the second side of the cassette adapter, and
   where the cassette further includes a third protrusion on a second side of the cassette and a fourth protrusion on the second side of the cassette,
   wherein the third protrusion is disposed against the third tower and the fourth protrusion is disposed against the fourth tower.

3. The data rack of claim 1, the cassette adapter further comprising a first latch on the first side of the cassette adapter and a second latch on the second side of the cassette adapter, wherein the first latch and the second latch are configured to restrict vertical movement with respect to the cassette adapter.

4. The data rack of claim 1, wherein the base of the cassette adapter includes at least one opening configured to allow for a force to be acted upon a bottom of the cassette to remove the cassette from the cassette adapter.

5. The data rack of claim 2, wherein the third protrusion and forth protrusion of the cassette reside on release latches configured to releasably engage the second tower and third tower of the cassette adapter.

6. A method of installing a cassette in a data rack, the method comprising:
   inserting the cassette between a first sidewall and a second sidewall at a front of a base of a cassette adapter;
   engaging a first protrusion on a first side of the cassette with a first tower adjacent the first sidewall and engaging a second protrusion of the cassette with a second tower at a rear of the cassette adapter;
   slidably attaching a first mounting portion and a second mounting portion the cassette adapter with a patch panel such that a portion of the cassette extends through a first rectangular opening in the patch panel; and
   engaging at least one latch of the cassette adapter on the first mounting portion with a guide of the patch panel.

7. The method of claim 6 further comprising engaging a third protrusion on a second side of the cassette with a third tower adjacent the second sidewall and engaging a fourth protrusion of the cassette with a fourth tower at the rear of the cassette adapter.

8. The method of claim 6 further comprising deflecting a first latch on the first side and a second latch on a second side of the cassette adapter until there is clearance between the first latch and second latch to accept the cassette therebetween.

* * * * *